US009431615B2

(12) United States Patent
Kim et al.

(10) Patent No.: US 9,431,615 B2
(45) Date of Patent: Aug. 30, 2016

(54) ORGANIC LIGHT-EMITTING DEVICE EMITTING DELAYED FLUORESCENCE

(71) Applicant: SAMSUNG DISPLAY CO., LTD., Yongin, Gyeonggi-Do (KR)

(72) Inventors: Younsun Kim, Yongin (KR); Seulong Kim, Yongin (KR); Dongwoo Shin, Yongin (KR); Jungsub Lee, Yongin (KR); Naoyuki Ito, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/644,153

(22) Filed: Mar. 10, 2015

(65) Prior Publication Data

US 2016/0087218 A1   Mar. 24, 2016

(30) Foreign Application Priority Data

Sep. 19, 2014   (KR) .................. 10-2014-0125245

(51) Int. Cl.
*H01L 51/00* (2006.01)
*H01L 51/52* (2006.01)
*H01L 51/50* (2006.01)

(52) U.S. Cl.
CPC ....... *H01L 51/0058* (2013.01); *H01L 51/0072* (2013.01); *H01L 51/5016* (2013.01); *H01L 51/5056* (2013.01); *H01L 51/5072* (2013.01);

(Continued)

(58) Field of Classification Search
CPC .......... H01L 51/0058; H01L 51/0072; H01L 51/5016; H01L 51/5056; H01L 51/5072; H01L 51/5206; H01L 51/5221
See application file for complete search history.

(56) References Cited

U.S. PATENT DOCUMENTS 9,082,995 B2 * 7/2015 Nishimura ............ C09K 11/06
2012/0241732 A1   9/2012 Endo et al.

(Continued)

FOREIGN PATENT DOCUMENTS

JP    2004-241374 A     8/2004
KR    10-2012-0112517 A   10/2012

(Continued)

OTHER PUBLICATIONS

Baldo, M.A. et al., Excitonic singlet-triplet ratio in a semiconducting organic thin film, Physical Review B, Nov. 15, 1999-II, vol. 60, No. 20, pp. 14 222-14 428, The American Physical Society.

(Continued)

*Primary Examiner* — Mamadou Diallo
(74) *Attorney, Agent, or Firm* — Lewis Roca Rothgerber Christie LLP

(57) ABSTRACT

An organic light-emitting device includes a first electrode; a second electrode facing the first electrode; and an emission layer between the first electrode and the second electrode, the emission layer including a dopant, a first host, and a second host. The dopant is a delayed fluorescence emitting material, and a triplet energy of the first host, $E_{H1}(T1)$ and a triplet energy of the second host, $E_{H2}(T1)$ are each equal to or greater than a triplet energy of the dopant, $E_D(T1)$. The triplet energy of the first host, $E_{H1}(T1)$ is in a range of about 2.6 eV to about 3.1 eV.

13 Claims, 1 Drawing Sheet

(52) U.S. Cl.
CPC ........ *H01L 51/5088* (2013.01); *H01L 51/5092* (2013.01); *H01L 51/5096* (2013.01); *H01L 51/5206* (2013.01); *H01L 51/5221* (2013.01); *H01L 2251/301* (2013.01); *H01L 2251/308* (2013.01); *H01L 2251/5384* (2013.01)

(56) References Cited

U.S. PATENT DOCUMENTS

| | | | |
|---|---|---|---|
| 2013/0001541 | A1 | 1/2013 | Hayashi |
| 2015/0340623 | A1* | 11/2015 | Kawamura .......... C07D 219/06 257/40 |

FOREIGN PATENT DOCUMENTS

| | | |
|---|---|---|
| KR | 10-2013-0053388 A | 5/2013 |
| KR | 10-2013-0074654 A | 7/2013 |
| KR | 10-2013-0115027 A | 10/2013 |
| WO | WO 2013/154342 A1 | 10/2013 |

OTHER PUBLICATIONS

Endo, Ayataka et al,, Efficient up-conversion of triplet excitons into a singlet state and its application for organic light emitting diodes, Applied Physics Letters, 2011, 98, 083302, 4 pages, American Institute of Physics.

Sato, Keigo et al., Organic Luminescent Molecule with Energetically Equivalent Singlet and Triplet Excited States for Organic Light-Emitting Diodes, Physical Review Letters, 2013, PRL 110, 247401, 5 pages, American Physical Society.

* cited by examiner

ORGANIC LIGHT-EMITTING DEVICE EMITTING DELAYED FLUORESCENCE

CROSS-REFERENCE TO RELATED APPLICATION

This application claims priority to and the benefit of Korean Patent Application No. 10-2014-0125245, filed on Sep. 19, 2014, in the Korean Intellectual Property Office, the entire disclosure of which is incorporated herein by reference.

BACKGROUND

1. Field

One or more aspects of one or more embodiments of the present disclosure relate to an organic light-emitting device emitting delayed fluorescence.

2. Description of the Related Art

In an organic light-emitting device (OLED), holes provided from an anode and electrons provided from a cathode are combined in an organic emission layer formed between the anode and the cathode to generate light. Such OLED devices typically have good color reproduction properties and color purity, short response times, self-emitting characteristics, small thickness, light-weight properties, high contrast ratios, side viewing angles, low driving voltages, and/or low power consumptions. Due to these properties, OLEDs are widely used for television sets, computer monitors, mobile communication terminals, MP3 players, automobile navigation devices, and a variety of other devices.

An organic light-emitting device generally includes a substrate, an anode, a hole transport layer, an emission layer, an electron transport layer and a cathode that are sequentially stacked in the stated order. When a voltage is applied between the anode and the cathode, holes provided from the anode are injected into the emission layer through the hole transport layer, and electrons provided from the cathode are injected into the emission layer through the electron transport layer. In the emission layer, the holes and the electrons are recombined to produce excitons, which then radiatively decay to emit light having a wavelength corresponding to a band gap of the material that constitutes the emission layer.

Materials for forming the emission layer may be classified into a fluorescent material using a singlet state S1 emission mechanism and a phosphorescent material using a triplet state T1 emission mechanism. These luminescent materials may be used alone or may be doped on a host, and a generation ratio of a singlet exciton to a triplet exciton in the emission layer is statistically 1:3.

Recently, organic light-emitting devices using delayed fluorescence have been actively developed, in addition to organic light-emitting devices using fluorescence emitted from an excited singlet state, or using phosphorescence emitted from an excited triplet state. Delayed fluorescence refers to a fluorescent emission that activates an energy up-conversion from a lower energy excited triplet state to a higher energy excited singlet state. Since delayed fluorescence is emitted from the singlet state via the triplet state, delayed fluorescence, in general, has a long lifespan.

For the ease of energy up-conversion from the triplet state to the singlet state, it is advantageous for the luminescent material to have a relatively small energy difference between the triplet state and the singlet state. In addition, when a luminescent material acts as a dopant, its ability to maximize the conversion of the triplet excited state into the singlet excited state may be influenced by the triplet energy level of a host. For example, when the host has a high triplet energy level, charges may not be effectively injected from adjacent layers due to the host's large band gap energy, and because of the host's short conjugation length, charge transport characteristics may decrease.

SUMMARY

One or more aspects of one or more embodiments of the present disclosure relate to an organic light-emitting device including an emission layer emitting blue delayed fluorescence with high efficiency and improved roll-off characteristics (e.g., decreased efficiency roll-off characteristics).

Additional aspects will be set forth in part in the description which follows and, in part, will be apparent from the description, or may be learned by practice of the presented embodiments.

According to one or more exemplary embodiments, an organic light-emitting device includes a first electrode; a second electrode facing the first electrode; and an emission layer between the first electrode and the second electrode, the emission layer including a dopant, a first host, and a second host.

The dopant may include a delayed fluorescence emitting material. A triplet energy of the first host, $E_{H1}(T1)$, and a triplet energy of the second host, $E_{H2}(T1)$, may each be equal to or greater than a triplet energy of the dopant, $E_D(T1)$. In some embodiments, the triplet energy of the first host, $E_{H1}(T1)$, is in a range of about 2.6 eV to about 3.1 eV.

An energy gap between the triplet energy and singlet energy of the delayed fluorescence emitting dopant may be in a range of about 0.01 eV to about 0.3 eV.

In some embodiments, the triplet energy of the first host is greater than the triplet energy of the second host. In some embodiments, electron mobility of the second host may be greater than electron mobility of the first host. In some embodiments, hole mobility of the second host may be greater than hole mobility of the first host.

An amount of the dopant in the emission layer may be in a range of about 0.01 parts by weight to about 30 parts by weight.

Also, a weight ratio of the first host to the second host may be in a range of about 10:90 to about 90:10.

The emission layer may emit blue light.

A hole transport region may further be included between the first electrode and the emission layer.

An electron transport region may further be included between the second electrode and the emission layer.

The hole transport region may include at least one selected from an electron blocking layer, a hole transport layer, and a hole injection layer.

The electron transport region may include at least one selected from a hole blocking layer, an electron transport layer, and an electron injection layer.

The first electrode may be an anode, and the second electrode may be a cathode.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
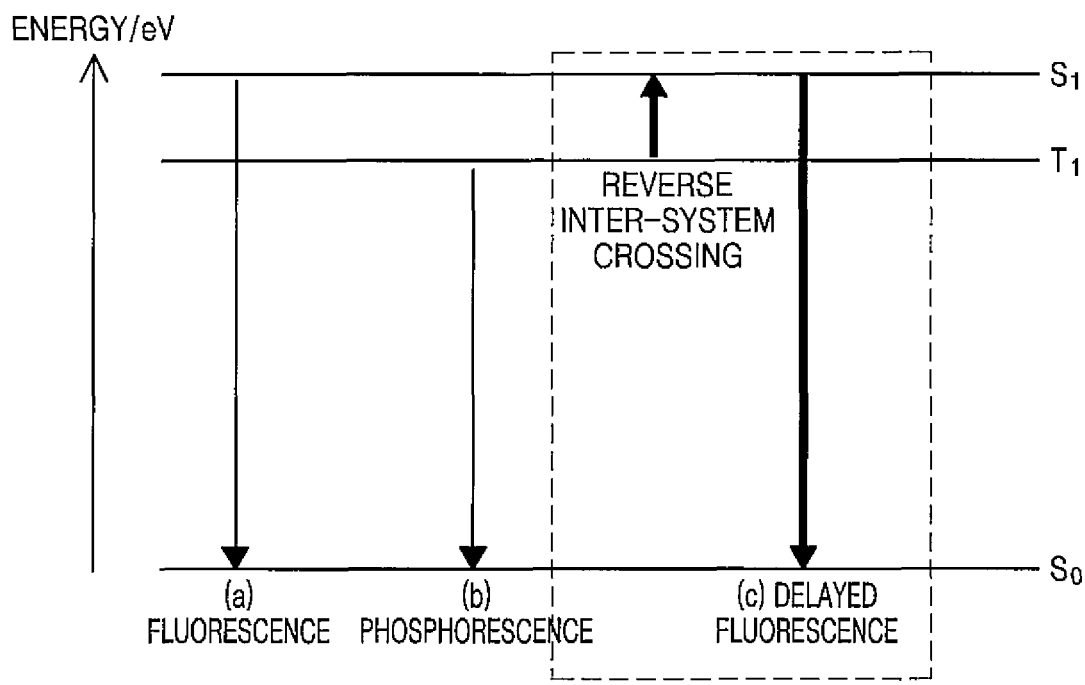
FIG. 1 is an energy level diagram illustrating aspects of delayed fluorescence of a luminescent material.

Reference will now be made in detail to embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

It will be understood that when a layer, region, or component is referred to as being "formed on" another layer, region, or component, it can be directly or indirectly formed on the other layer, region, or component. In other words, intervening layers, regions, or components may be present. In addition, as used herein, the terms "use," "using," and "used" may be considered synonymous with the terms "utilize," "utilizing," and "utilized," respectively. As used herein, the term "substantially," "about," "relatively" and similar terms are used as terms of approximation and not as terms of degree, and are intended to account for the inherent deviations in measured or calculated values that would be recognized by those of ordinary skill in the art. Also, the term "exemplary" is intended to refer to an example or illustration.

An emission layer of an organic light-emitting device according to some embodiments of the present disclosure may include a blue emitting dopant and a host.

The dopant may include a blue delayed fluorescence emitting material. The delayed fluorescence refers to the fluorescence from a singlet state $S_1$ that has been converted from a triplet state $T_1$, where the energy level of the singlet state is higher than that of the triplet state $T_1$.

FIG. 1 is an energy level diagram showing a ground state energy level $S_0$, a triplet energy level $T_1$, and a singlet energy level $S_1$ of a luminescent material. In FIG. 1, (a) indicates fluorescent emission occurring when the singlet energy level $S_1$ is converted into the ground state energy level $S_0$, and the energy is lost in the form of light; (b) indicates phosphorescent emission occurring when the triplet energy level $T_1$ is converted into the ground state energy level $S_0$, and the energy is lost in the form of light; and (c) indicates delayed fluorescent emission occurring when the singlet energy level $S_1$, which is populated by an up-conversion energy transfer from the triplet energy level $T_1$ to the singlet energy level $S_1$, is converted into the ground state energy level $S_0$.

In some embodiments, the delayed fluorescence emitting dopant may be a compound that satisfies Equation 1, in which a gap $\Delta E_D$ between a triplet energy $E_D(T1)$ and a singlet energy $E_D(S1)$ of the dopant may be in a range of about 0.01 eV to about 0.3 eV.

$$0.01 \text{ eV} \leq \Delta E_D = E_D(S1) - E_D(T1) \leq 0.3 \text{ eV} \qquad \text{<Equation 1>}$$

When $\Delta E_D$ is within the aforementioned range, a transition from the triplet state to the singlet state may be facilitated.

The dopant may be at least one selected from compounds represented by Formula 1, Formula 2, Formula 3, and Formula 4.

$[EDG]_m\text{-}\{A_n\text{-}[EWG]_o\}_p$        <Formula 1>

$[EWG]_q\text{-}\{A_r\text{-}[EDG]_s\}_t$        <Formula 2>

$[EWG]\text{-}A\text{-}[EDG]\text{-}B\text{-}[EWG]$        <Formula 3>

$[EDG]\text{-}A\text{-}[EWG]\text{-}B\text{-}[EDG]$.        <Formula 4>

An electron donating group (EDG) includes a functional group that provides an electron donating effect due to an electron pair in a π orbital or a lone electron pair. For example, EDG may include a group selected from —C═C—R, —O—R, —N(R)H, —N(R)$_2$, —NH$_2$, —OH, —NH(CO)—R, a substituted or unsubstituted aryl group, a substituted or unsubstituted aromatic condensed cyclic group, a furanyl group or a derivative thereof, a benzofuranyl group or a derivative thereof, a dibenzofuranyl group or a derivative thereof, a thiophenyl group or a derivative thereof, a benzothiophenyl group or a derivative thereof, a dibenzothiophenyl group or a derivative thereof, a fluorenyl group or a derivative thereof, spirofluorenyl group or a derivative thereof, and an indenyl group or a derivative thereof. In some embodiments, EDG may include a substituted or unsubstituted $C_1$-$C_{20}$ alkyl group.

An electron withdrawing group (EWG) includes a functional group that provides electron withdrawing effect due to including an element with a higher electronegativity than that of carbon, or to forming a partially positive charge. For example, EWG may be selected from —X(—F, —Cl, —Br, —I), —C(═O)H, —C(═O)—R, —C(═O)O—R, —C(═O)OH, —(C═O)Cl, —CF$_3$, —C≡N, —S(═O)$_2$—OH, —S(═O)$_2$—O—R, —N$^+$H$_3$, —N$^+$R$_3$, —(N$^+$═O) ═O$^-$, a substituted or unsubstituted N-containing 5-membered ring group, a substituted or unsubstituted N-containing 6-membered ring group, a substituted or unsubstituted N-containing 5-membered ring group that is fused with a 6-membered ring, and a substituted or unsubstituted N-containing 6-membered ring group that is fused with a 6-membered ring.

In addition, R(s) may be each independently a hydrogen, a deuterium, a $C_6$-$C_{30}$ aryl group, a $C_2$-$C_{30}$ heteroaryl group; or a $C_6$-$C_{30}$ aryl group or $C_2$-$C_{30}$ heteroaryl group, each substituted with at least one selected from a $C_1$-$C_{10}$ alkyl group, a $C_1$-$C_{10}$ alkoxy group, a $C_6$-$C_{30}$ aryl group, a $C_2$-$C_{30}$ heteroaryl group, a $C_6$-$C_{30}$ aryloxy group, and a $C_6$-$C_{30}$ arylthio group.

A and B are linking groups that link the EDG and the EWG, and may each independently be, for example, a single bond, a $C_1$-$C_{30}$ alkylene group, or a $C_6$-$C_{30}$ arylene group.

m, q, o, s, p, and t may each independently be an integer selected from 1 to 10, and n and r may each independently be 0 or 1.

Examples of the compound represented any one selected from Formula 1 to Formula 4 include compounds illustrated below, but are not limited thereto.
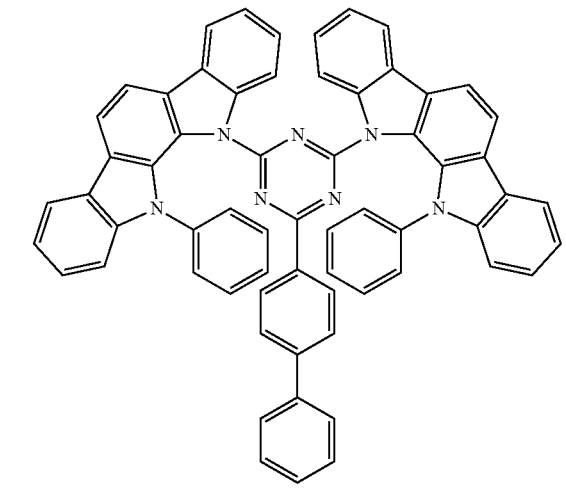
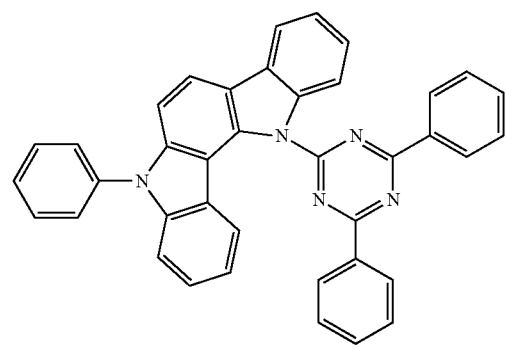
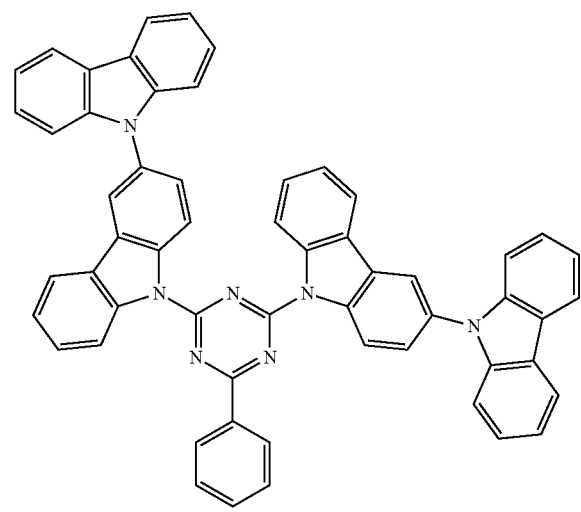
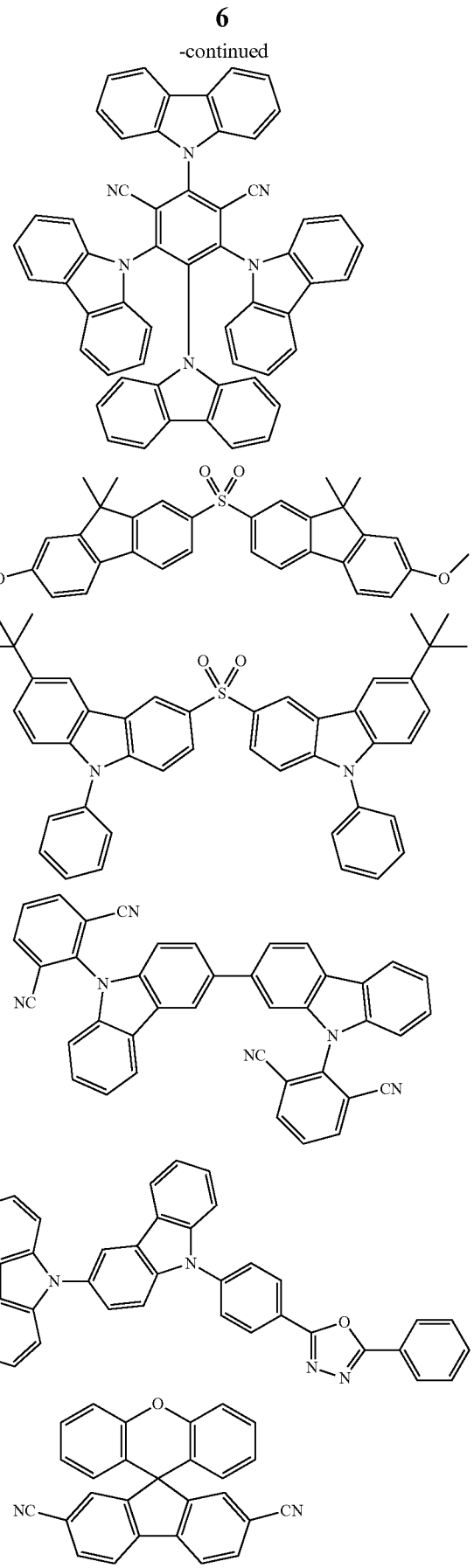

-continued

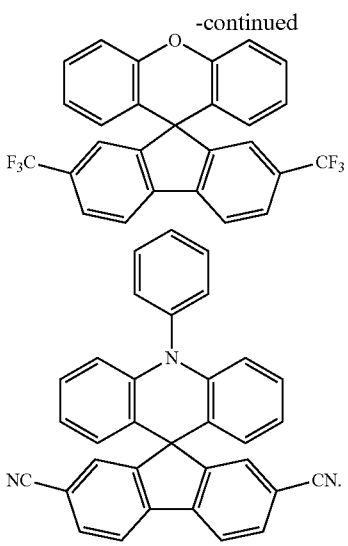

The host may include a first host and a second host.

Triplet energies of the first host and the second host may satisfy Equation 2 and may be equal to or greater than the triplet energy of the dopant.

$E_{H1}(T1) \geq E_D(T1)$, and $E_{H2}(T1) \geq E_D(T1)$  <Equation 2>

Accordingly, both the first host and the second host may transfer the triplet energy to the triplet energy of the dopant.

In addition, the triplet energy of at least one selected from the first host and second host may satisfy Equation 3 and may be in a range of about 2.6 eV to about 3.1 eV. For example, the triplet energy of the first host may be in a range of about 2.6 eV to about 3.1 eV. Here, the triplet energy of the first host may be greater than the triplet energy of the second host. In some embodiments, the triplet energy of the first host or the second host may be in a range of about 2.6 eV to about 3.1 eV. In some embodiments, the triplet energy of the first host may be greater than the triplet energy of the second host.

$2.6 \text{ eV} < E_{H1}(T1) < 3.1 \text{ eV}$  <Equation 3>

In the case of a comparative blue emitting dopant, an energy band gap of the dopant is large, and thus the level of the triplet energy and the singlet energy may be increased (e.g., the gap between the triplet energy level and the singlet energy level may be too large for the electrons to effectively transition from the excited triplet state to the singlet excited state). However, when a dopant has characteristics for a delayed fluorescent emission, the gap between the triplet energy level and the singlet energy level of the dopant is relatively small, and a molecular orbital distribution is similar, and thus an energy reverse-transfer (or up-conversion energy transfer) may occur, in which electrons transition from an excited triplet state to a singlet excited state. Therefore, the triplet energy level of a delayed fluorescence emitting dopant may be higher compared to that of a comparative blue emitting dopant.

Additionally, the triplet energy level of the host that would satisfy Equation 3 is in a relatively higher range than the triplet energy level of a comparative blue emitting host. Accordingly, when the triplet energy level of at least one selected from the first host and the second host of embodiments of the present disclosure is within the aforementioned range, luminescent efficiency may be improved by securing a suitable distance from the triplet energy level of the dopant to the triplet energy level of the host.

In addition, if only one host having the triplet energy that satisfies Equations 2 and 3 is used, an electron transport and injection characteristics of the host may not be satisfactory, since the electron mobility of the host may not be sufficiently high, and electron transport characteristic may deteriorate, thus breaking a charge balance of the emission layer, reducing efficiency, and increasing an efficiency roll-off. However, when a mixed host is used, electron transport and injection characteristics of the host may be improved.

In some embodiments, a material for the second host may satisfy Equations 2 and 3, and may have better electron transport characteristics than those of the first host. For example, electron mobility of the second host may be greater than electron mobility of the first host. In some embodiments, hole mobility of the second host may be greater than hole mobility of the first host.

Compounds represented by Formula 5 to Formula 7 may be used as the first host. In some embodiments, the second host is different from the first host and the second host may also be one of compounds represented by Formula 5 to Formula 7.

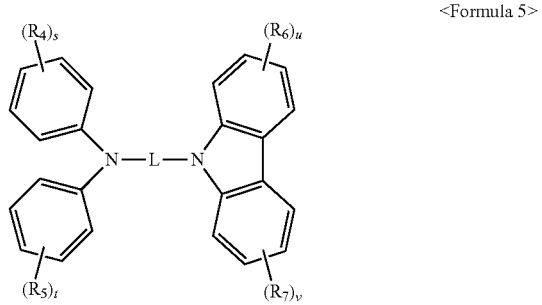

<Formula 5>

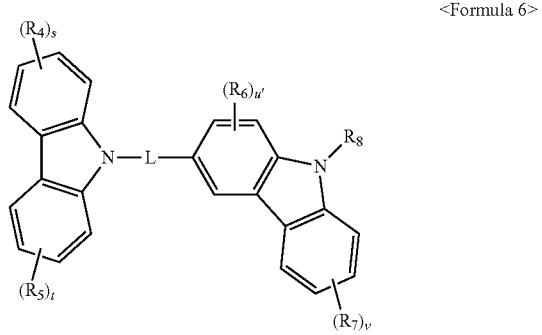

<Formula 6>

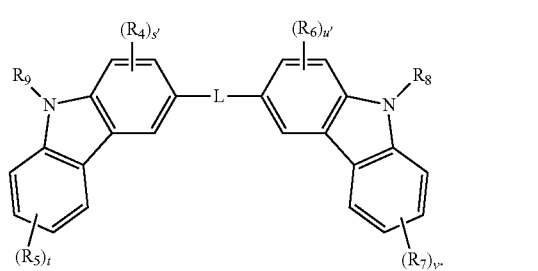

<Formula 7>

In Formula 5 to Formula 7,

L may be a single bond, a $C_6$-$C_{30}$ arylene group; a $C_2$-$C_{30}$ heteroarylene group; or a $C_6$-$C_{30}$ arylene group or $C_2$-$C_{30}$ heteroarylene group, each substituted with at least one selected from a deuterium, a halogen atom, a hydroxyl group, a cyano group, a nitro group, an amino group, —$NQ_1Q_2$ (where $Q_1$ and $Q_2$ are each independently a $C_6$-$C_{30}$ aryl group), a $C_1$-$C_{10}$ alkyl group, a $C_1$-$C_{10}$ alkoxy group, a $C_6$-$C_{30}$ aryl group, a $C_2$-$C_{30}$ heteroaryl group, a $C_6$-$C_{30}$ aryloxy group, and a $C_6$-$C_{30}$ arylthio group, $R_4$ to $R_9$ may be each independently a $C_6$-$C_{30}$ aryl group; a $C_2$-$C_{30}$ heteroaryl group; or a $C_6$-$C_{30}$ aryl group or $C_2$-$C_{30}$ heteroaryl group, each substituted with at least one selected from a deuterium, a halogen atom, a hydroxyl group, a cyano group, a nitro group, an amino group, —$NQ_1Q_2$ (where $Q_1$ and $Q_2$ are each independently a $C_6$-$C_{30}$ aryl group), a $C_1$-$C_{10}$ alkyl group, a $C_1$-$C_{10}$ alkoxy group, a $C_6$-$C_{30}$ aryl group, a $C_2$-$C_{30}$ heteroaryl group, a $C_6$-$C_{30}$ aryloxy group, and a $C_6$-$C_{30}$ arylthio group, s, t, u and v may each independently be an integer from 0 to 4, and s' and u' may each independently be an integer from 0 to 3.

Examples of a compound represented by any one of Formula 5 to Formula 7 include compounds illustrated below, but are not limited thereto.

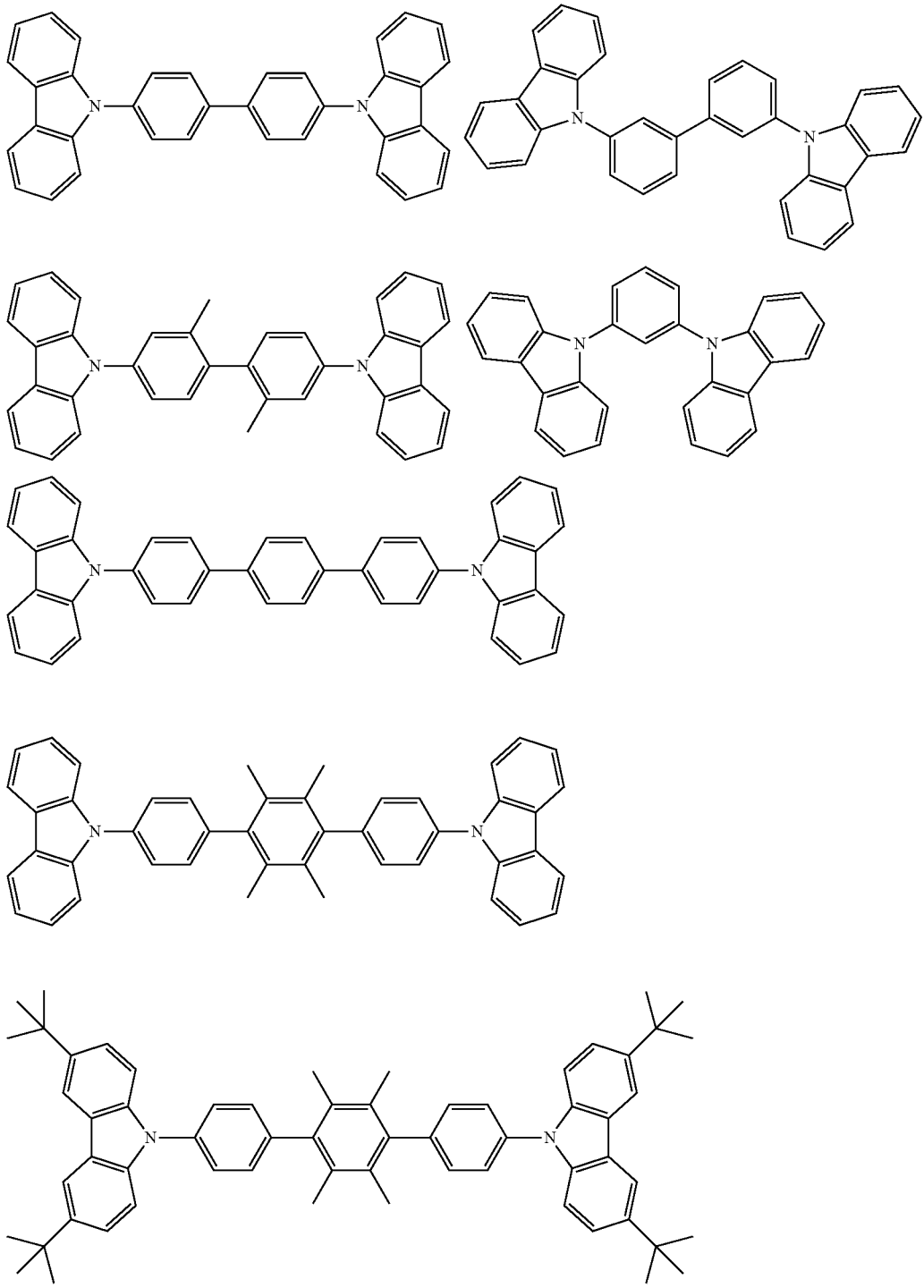

-continued
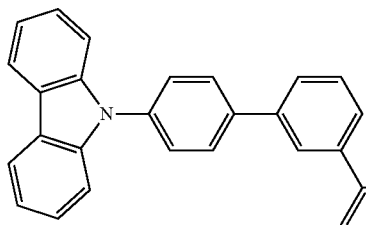
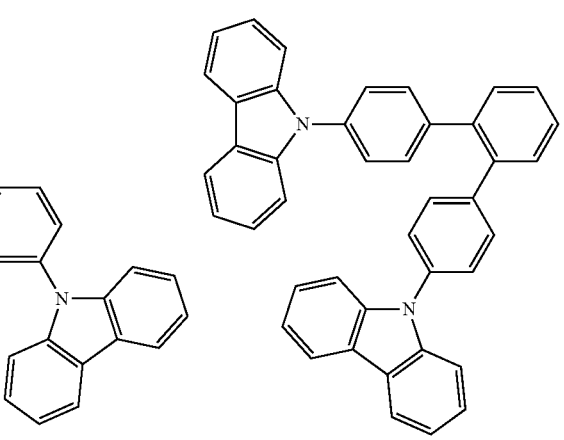
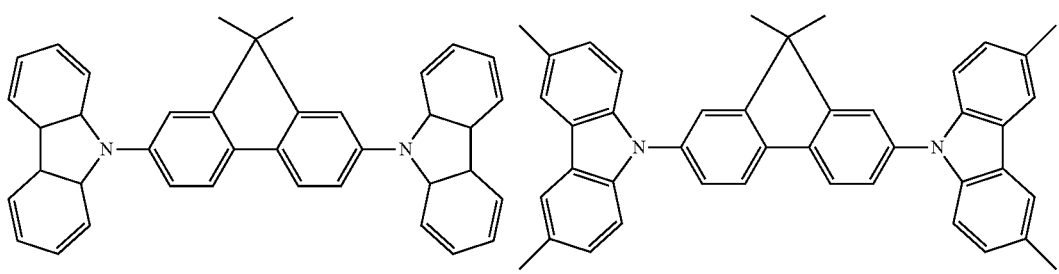
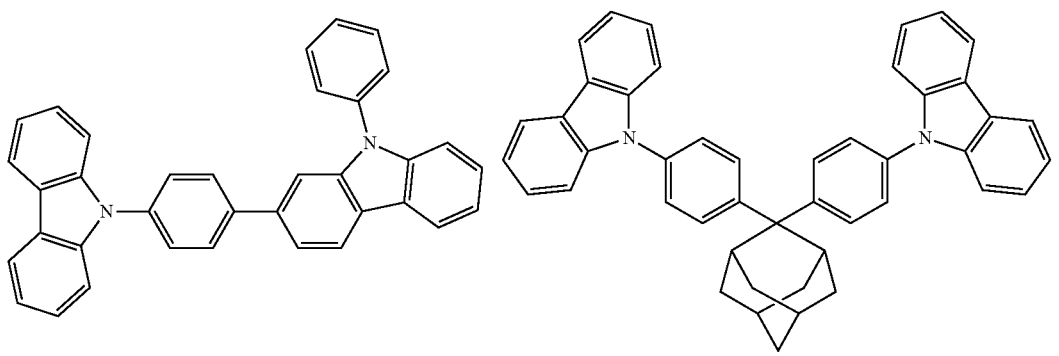
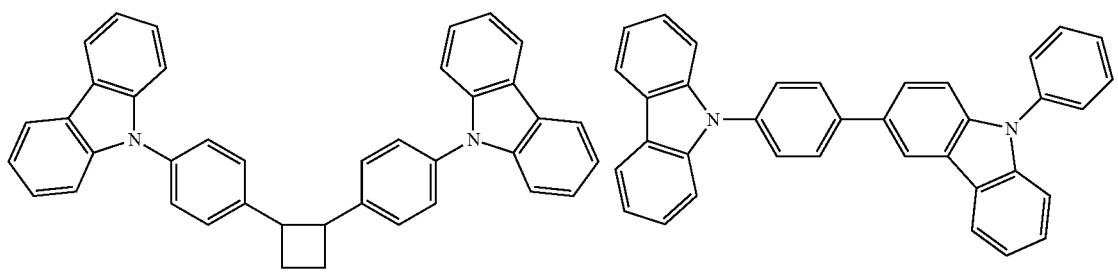
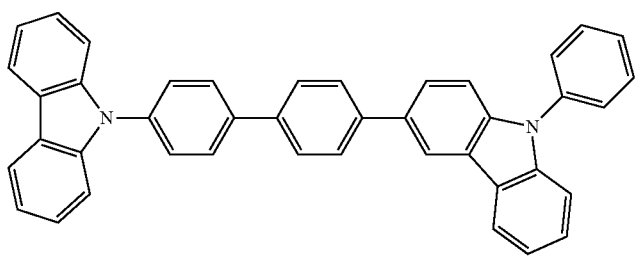

-continued
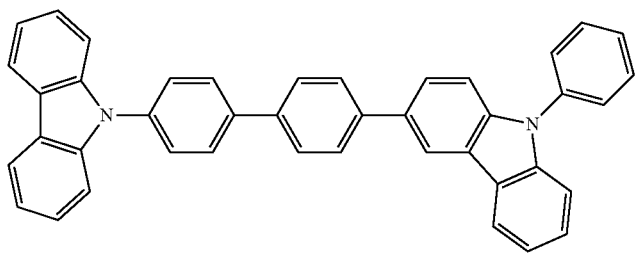
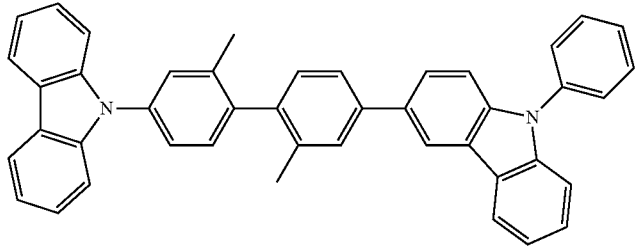
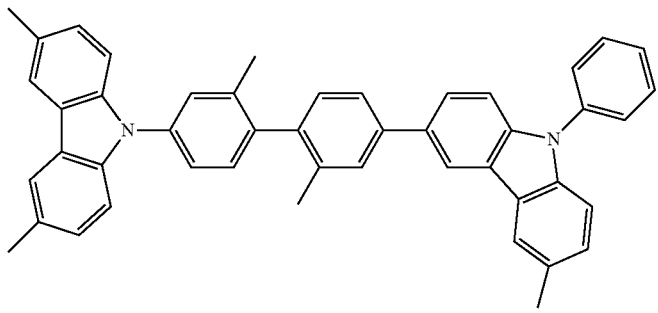
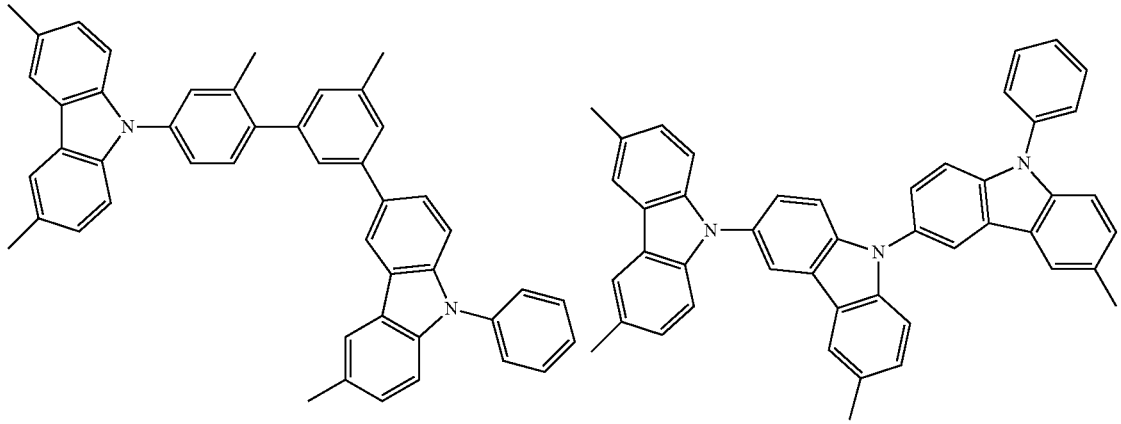
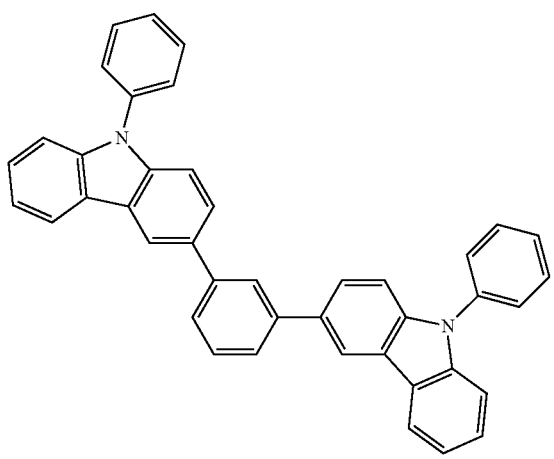

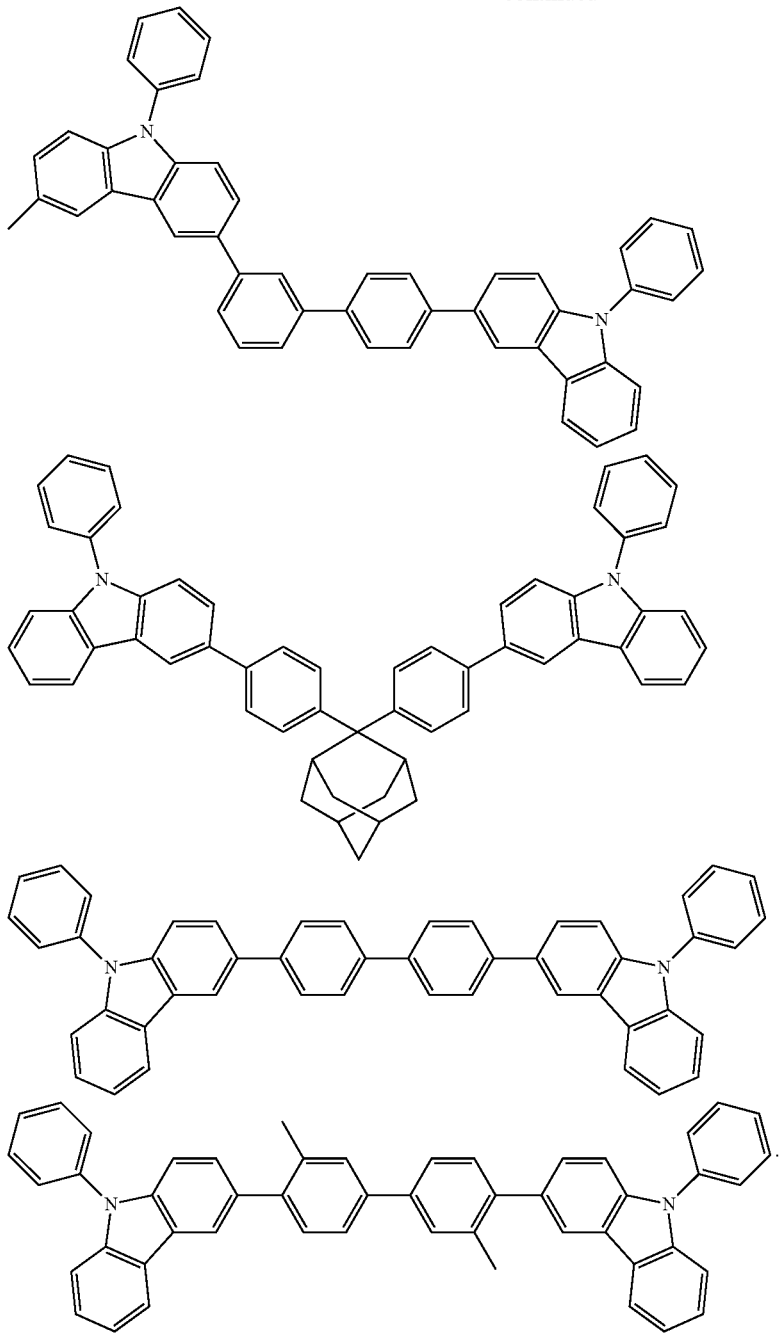

An amount of the dopant in the emission layer may be in a range of about 0.01 parts by weight to about 30 parts by weight. Also, a weight ratio of the first host to the second host may be in a range of about 10:90 to about 90:10.

Hereinafter, an organic light-emitting device including an emission layer according to some embodiments of the present disclosure will be explained in detail.

Figure 2:
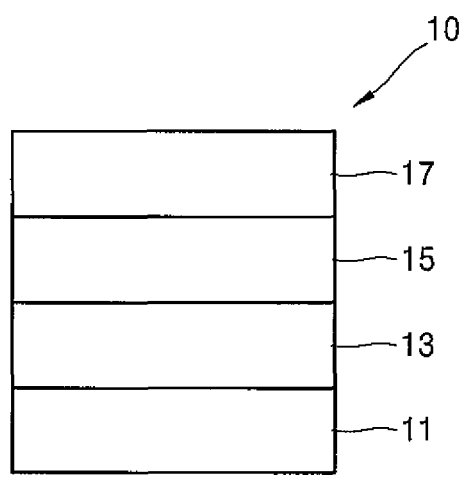
FIG. 2 is a schematic cross-sectional view of an organic light-emitting device according to some embodiments of the present disclosure.

FIG. 2 is a schematic view of an organic light-emitting device 10 according to some embodiments.

Referring to FIG. 2, an organic light-emitting device 10 may include a substrate 11, a first electrode 13, an organic layer 15, and a second electrode 17, stacked upon one another in the stated order.

As the substrate 11, any suitable substrate that is commonly used in connection with organic light-emitting devices may be used. In some embodiments, the substrate 11 may be a glass substrate or a transparent plastic substrate, each with good mechanical strength, thermal stability, transparency, surface smoothness, ease of handling, and/or water repellency.

The first electrode 13 may be formed by, for example, depositing and/or sputtering a material for a first electrode on the substrate 11. When the first electrode 13 is an anode, the material for the first electrode may be selected from materials with a high work function and capable of facilitating hole injection. The first electrode 13 may be a transmissive electrode or a reflective electrode. The material for the first electrode 13 may be, for example, a transmissive and highly conductive material, and non-limiting examples of such material include indium tin oxide (ITO), indium zinc oxide (IZO), tin oxide ($SnO_2$), and zinc oxide (ZnO). In some embodiments, magnesium (Mg), silver (Ag), aluminum (Al), aluminum:lithium (Al:Li), potassium (Ca), silver:tin indium oxide (Ag:ITO), magnesium:indium (Mg:In), or magnesium:silver (Mg:Ag) may be used to form a reflective electrode for use as the first electrode 13. The first electrode 13 may have a single-layer structure, or a multi-layer structure including two or more layers. For example, the first electrode 13 may have a three-layer structure of ITO/Ag/ITO, but the structure of the first electrode 13 is not limited thereto.

In some embodiments, the organic layer 15 is positioned on the first electrode 13.

The organic layer 15 may include a hole transport region, an emission layer, and an electron transport region.

The hole transport region may include at least one selected from a hole injection layer, a hole transport layer, and an electron blocking layer. The electron transport region may include at least one selected from an electron injection layer, an electron transport layer, and a hole blocking layer.

A hole injection layer (HIL) may be formed on the first electrode 13 by using one or more suitable methods such as vacuum deposition, spin coating, casting, langmuir-blodgett (LB) deposition, and/or the like.

When forming the hole injection layer using the vacuum deposition method, deposition conditions may vary depending on compounds used as materials for the hole injection layer and a target structure and thermal characteristics of the hole injection layer to be formed. The deposition conditions, for example, may include a deposition temperature in a range of about 100° C. to about 500° C., a degree of vacuum in a range of about $10^{-8}$ torr to about $10^{-3}$ torr, and a deposition rate in a range of about 0.01 ksec to about 100 Å/sec. However, the deposition conditions are not limited thereto.

When forming the hole injection layer using the spin coating method, coating conditions may vary depending on compounds used as materials for the hole injection layer and a target structure and thermal characteristics of the hole injection layer to be formed. For example, the coating conditions may include a coating rate in a range from about 2,000 rpm to about 5,000 rpm. In addition, to remove a solvent after the coating process, a thermal treatment temperature may be in a range from about 80° C. to about 200° C. However, the coating conditions are not limited thereto.

A material for the hole injection layer may be, for example, any suitable hole injection material. Non-limiting examples of the hole injection material may include a phthalocyanine compound such as copper phthalocyanine, DNTPD (N,N'-diphenyl-N,N'-bis-[4-(phenyl-m-tolyl-amino)-phenyl]-biphenyl-4,4'-diamine, N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino)triphenylamine, 4,4',4"-tris(3-methylphenylphenylamino)triphenylamine), TDATA (4,4'4"-Tris(N,N-diphenylamino)triphenylamine, 4,4',4"-tris(N,N'-diphenylamino)triphenylamine), 2T-NATA (4,4',4"-tris{N,-(2-naphthyl)-N-phenylamino}-triphenylamine, 4,4',4"-tris{N,-(2-naphthyl)-N-phenylamino}-triphenylamine), α-NPD (N,N'-bis(naphthalen-1-yl)-N,N'-bis(phenyl)-2,2'-dimethylbenzidine, N,N'-bis(naphthalene-1-yl)-N,N'-bis(phenyl)-2,2'-dimethylbenzidine), PANI/DBSA (polyaniline/dodecylbenzenesulfonic acid, polyaniline/dodecylbenzenesulfonic acid), PEDOT/PSS (poly(3,4-ethylenedioxythiophene)/poly(4-styrenesulfonate), poly(3,4-ethylenedioxythiophene)/poly(4-styrene sulfonate)), PANI/CSA (polyaniline/camphor sulfonic acid, polyaniline/camphor sulfonic acid) or PANI/PSS (polyaniline)/poly(4-styrene sulfonate), polyaniline)/poly(4-styrene sulfonate)) and the like.

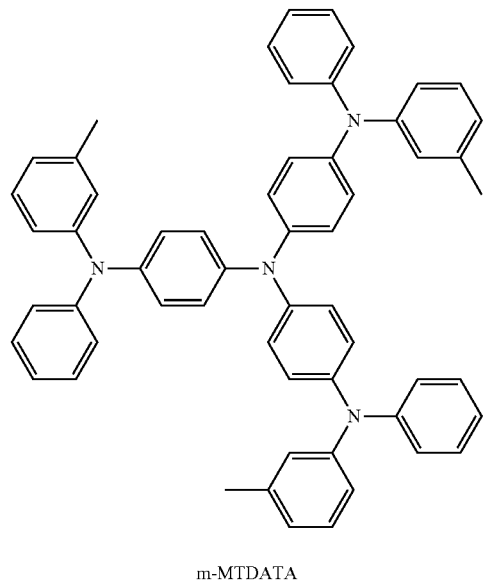

m-MTDATA

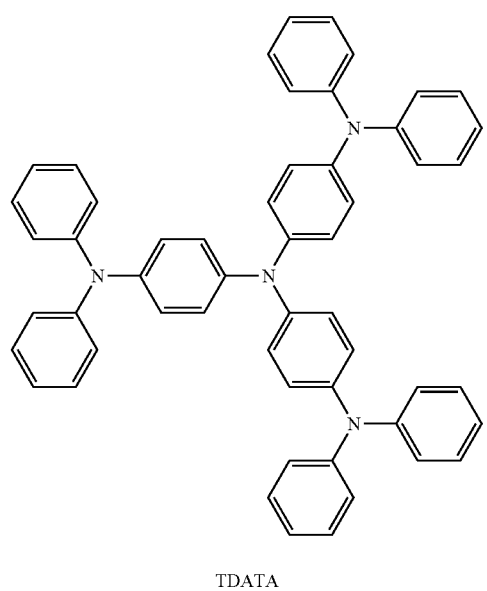

TDATA

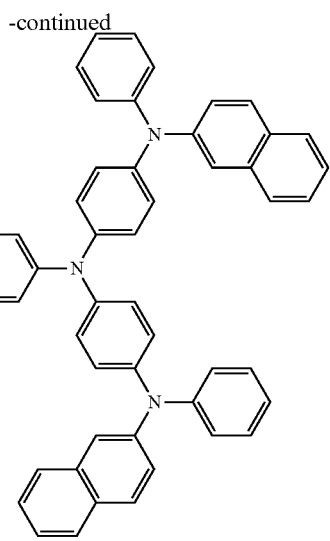

2T-NATA

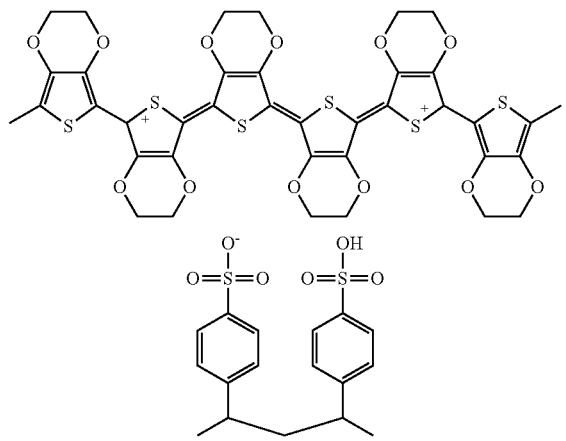

PEDOT/PSS

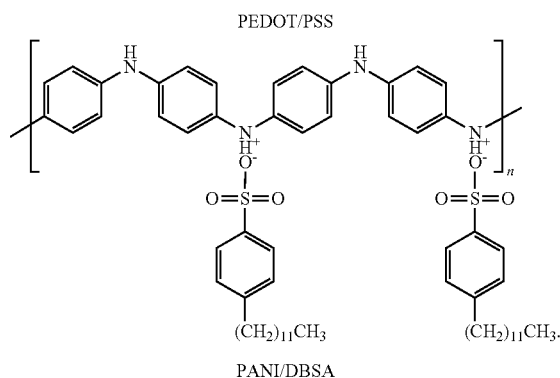

PANI/DBSA

A thickness of the hole injection layer may be in a range of about 100 Å to about 10,000 Å, for example, about 100 Å to about 1,000 Å. When the thickness of the hole injection layer is within any of the aforementioned ranges, the hole injection layer may have satisfactory hole injection characteristics without a substantial increase in a driving voltage.

Then, a hole transport layer (HTL) may be formed on the hole injection layer by using one or more suitable methods such as vacuum deposition, spin coating, casting, and/or LB. When the hole transport layer is formed by vacuum deposition and/or spin coating, the deposition and/or coating conditions may be similar to those applied to form the hole injection layer, although the deposition and/or coating conditions may vary depending on the material that is used to form the hole transport layer.

A material for the hole transport layer may be, for example, any suitable hole transport material. Non-limiting examples of the hole transport material may include a carbazole derivative such as N-phenylcarbazole, polyvinyl carbazole, a triphenylamine-based material such as TPD (N,N'-bis(3-methylphenyl)-N,N'-diphenyl-[1,1-biphenyl]-4,4'-diamine, N,N'-bis(3-methylphenyl)-N,N'-diphenyl-[1,1-biphenyl]-4,4'-diamine), NPB (N,N'-bis(naphthalen-2-yl)-N,N'-bis(phenyl)-benzidine, N,N'-bis(a naphthalene-1-yl)-N,N'-bis(phenyl)-bensidine), methylated-NPD (N,N'-bis(naphthalen-1-yl)-N,N'-bis(phenyl)-2,2'-dimethylbenzidine, N,N'-bis(a naphthalene-1-yl)-N,N'-bis(phenyl)-2,2'-dimethylbenzidine), TCTA (4,4',4"-tris(N-carbazolyl)triphenylamine, 4,4',4"-tris(N-carbazolyl)triphenylamine) and the like.

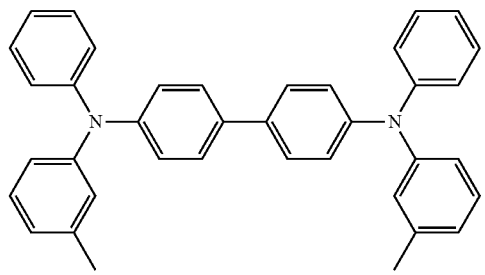

TPD

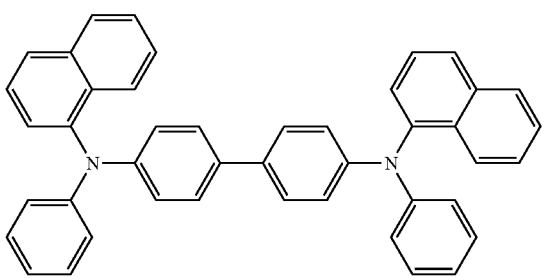

NPB

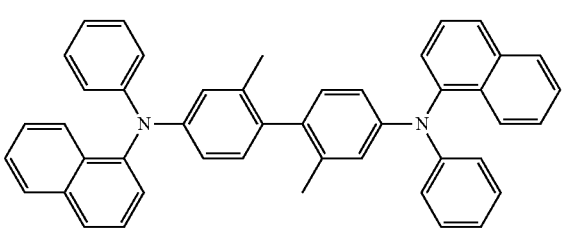

methylated NPB

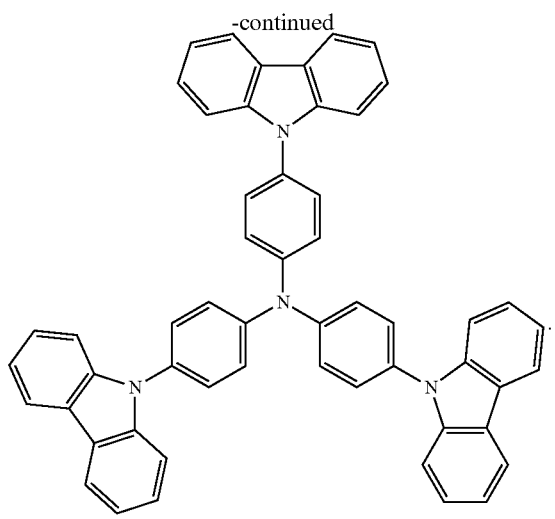

TCTA

A thickness of the hole transport layer may be in a range of about 50 Å to about 1,000 Å, for example, about 100 Å to about 800 Å. When the thickness of the hole transport layer is within any of the aforementioned ranges, hole transport characteristics may be improved without a substantial increase in driving voltage.

In some embodiments, instead of the hole injection layer and the hole transport layer, a hole injection and transport layer may be formed. The hole injection and transport layer may include at least one material selected from the materials described above in connection with the hole injection layer material and the hole transport layer material, and a thickness of the hole injection and transport layer may be in a range of about 500 Å to about 10,000 Å, for example, about 100 Å to about 1,000 Å. When the thickness of the hole injection and transport layer is within any of the aforementioned ranges, hole injection and transport characteristics may be improved without a substantial increase in driving voltage.

In addition, at least one layer selected from the hole injection layer, the hole transport layer, and the hole injection and transport layer may include at least one selected from compounds represented by Formula 100 and compounds represented by Formula 101:

Formula 100

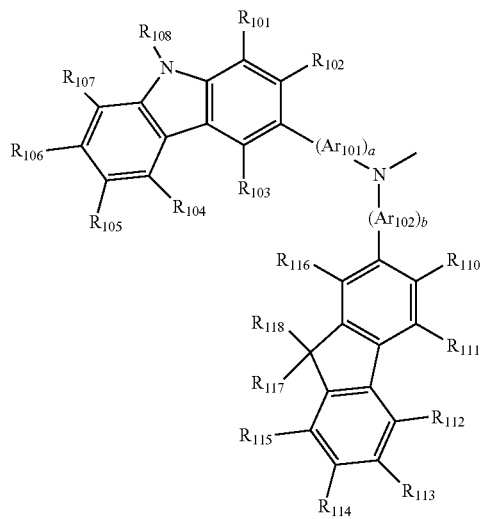

Formula 101

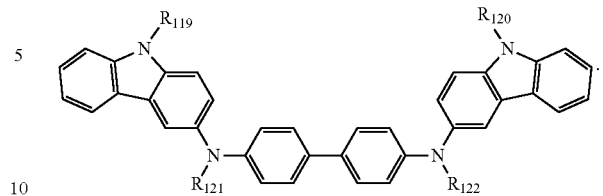

$Ar_{101}$ and $Ar_{102}$ in Formula 100 may be each independently a substituted or unsubstituted $C_6$-$C_{40}$ arylene group. For example, $Ar_{101}$ and $Ar_{102}$ may be each independently selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, and a pentacenylene group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{40}$ alkyl group, a $C_2$-$C_{40}$ alkenyl group, a $C_2$-$C_{40}$ alkynyl group, a $C_1$-$C_{40}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{40}$ aryl group, a $C_6$-$C_{40}$ aryloxy group, a $C_6$-$C_{40}$ arylthio group, and a $C_2$-$C_{40}$ heteroaryl group.

a and b in Formula 100 may be each independently an integer from 0 to 5, or an integer of 0, 1, or 2. For example, a may be 1 and b may be 0, but a and b are not limited thereto.

$R_{101}$ to $R_{122}$ in Formulae 100 and 101 may be each independently a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{40}$ alkyl group, a substituted or unsubstituted $C_2$-$C_{40}$ alkenyl group, a substituted or unsubstituted $C_2$-$C_{40}$ alkynyl group, a substituted or unsubstituted $C_1$-$C_4$ alkoxy group, a substituted or unsubstituted $C_3$-$C_{40}$ cycloalkyl group, a substituted or unsubstituted $C_6$-$C_{40}$ aryl group, a substituted or unsubstituted $C_6$-$C_{40}$ aryloxy group, or a substituted or unsubstituted $C_6$-$C_{40}$ arylthio group.

For example, $R_{101}$ to $R_{108}$ and $R_{110}$ to $R_{122}$ may be each independently selected from:

a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, and/or a hexyl group), a $C_1$-$C_{10}$ alkoxy group (for example, a methoxy group, an ethoxy group, a propoxy group, a butoxy group, and/or a pentoxy group), a phenyl group, a naphthyl group, an anthryl group, a fluorenyl group, and a pyrenyl group;

a $C_1$-$C_{10}$ alkyl group, a $C_1$-$C_{10}$ alkoxy group, a phenyl group, a naphthyl group, an anthryl group, a fluorenyl group, and a pyrenyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, but is not limited thereto.

$R_{109}$ in Formula 100 may be one selected from:

a phenyl group; a naphthyl group; anthryl group; a biphenyl group; and a pyridyl group; and a phenyl group, a naphthyl group, anthryl group, a biphenyl group, and a pyridyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to some embodiments, the compound represented by Formula 100 may be represented by Formula 100A, but is not limited thereto:

Formula 100A

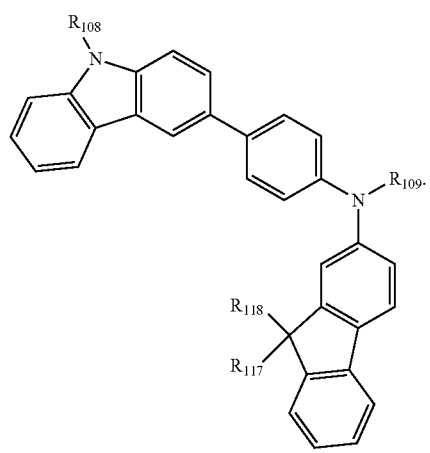

$R_{108}$, $R_{109}$, $R_{117}$, and $R_{118}$ in Formula 100A are as described above.

For example, at least one layer selected from the hole injection layer, the hole transport layer, and the hole injection and transport layer may include at least one selected from Compounds 102 to 121, but may instead (or in addition to) include other materials.

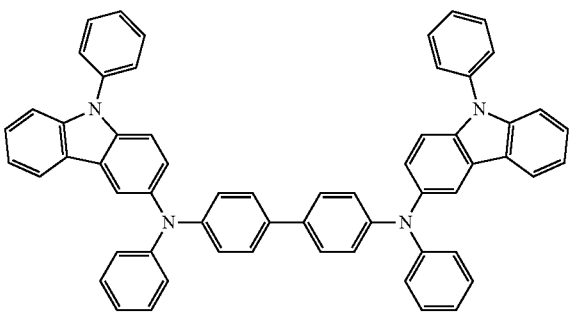

102

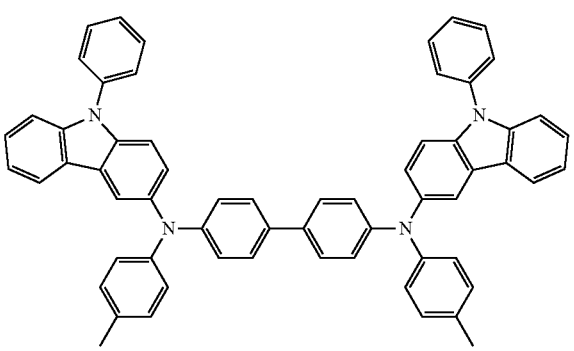

103

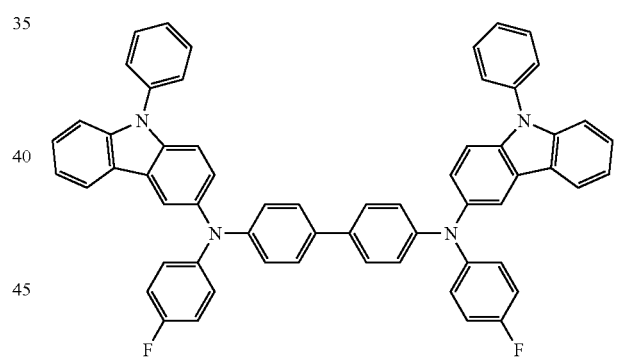

104

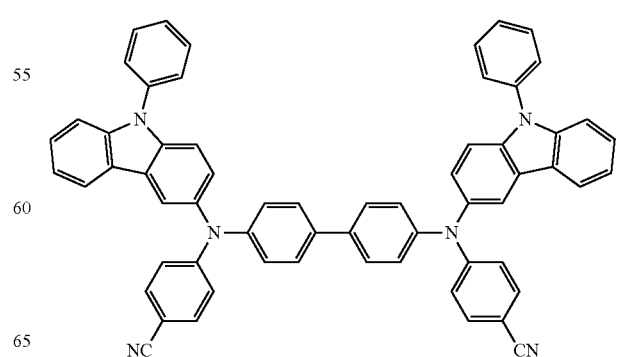

105

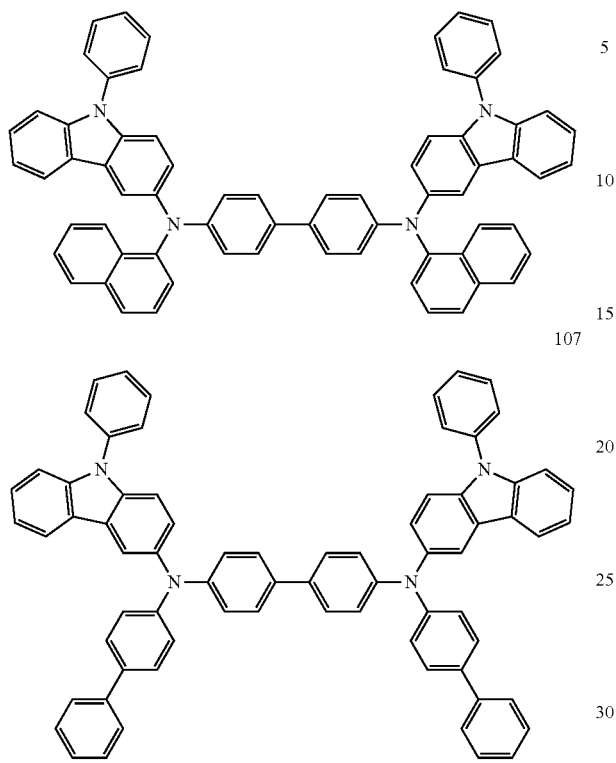
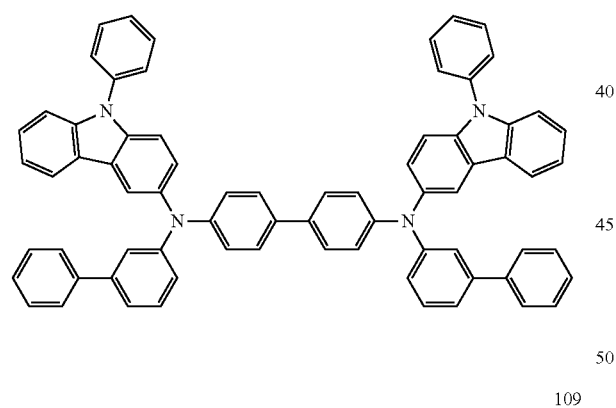
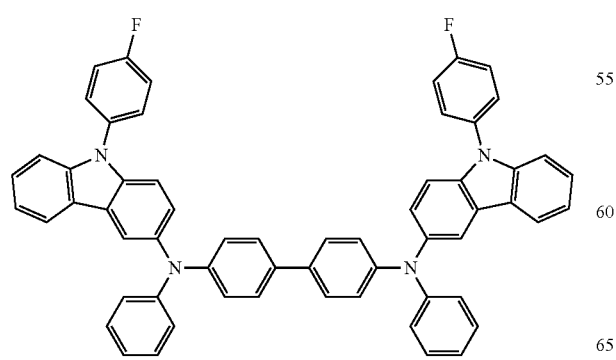
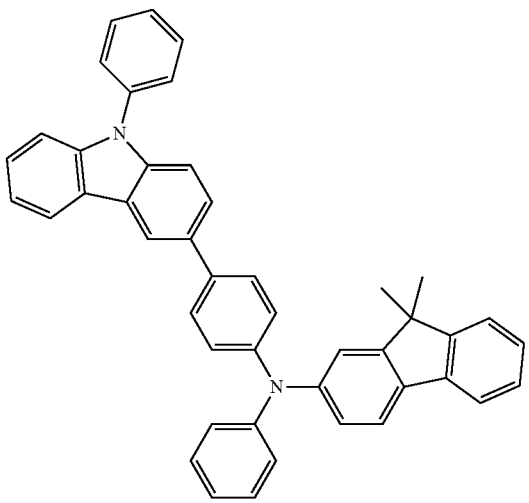
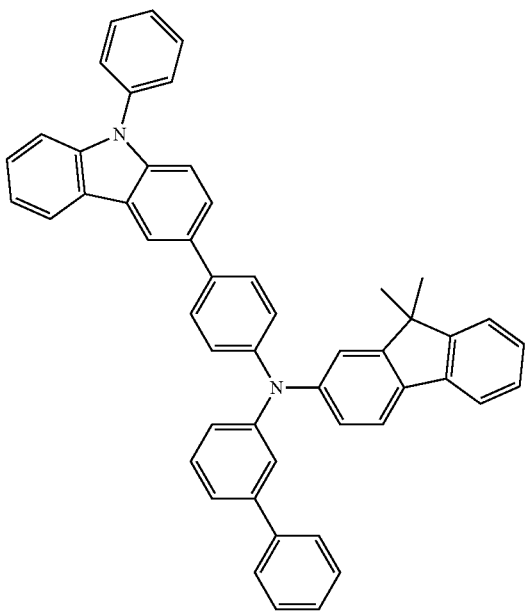

112
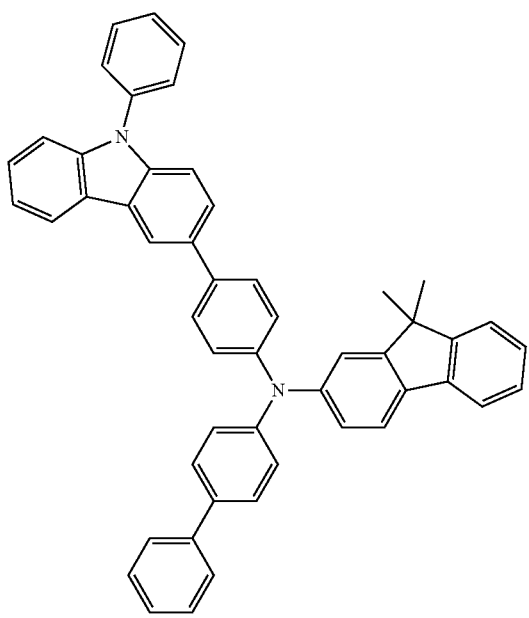
113
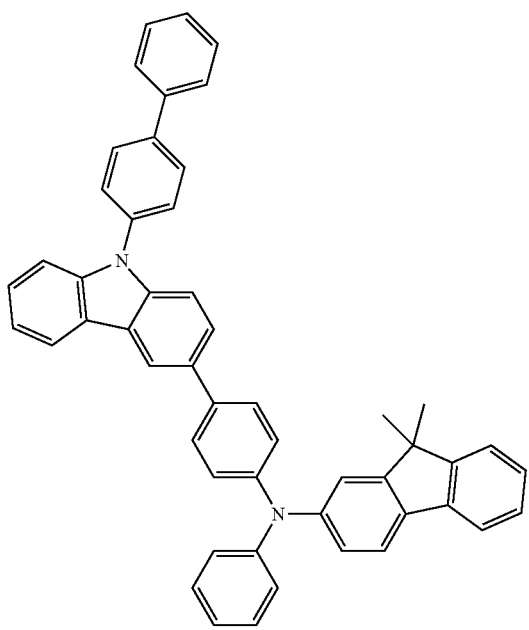
114
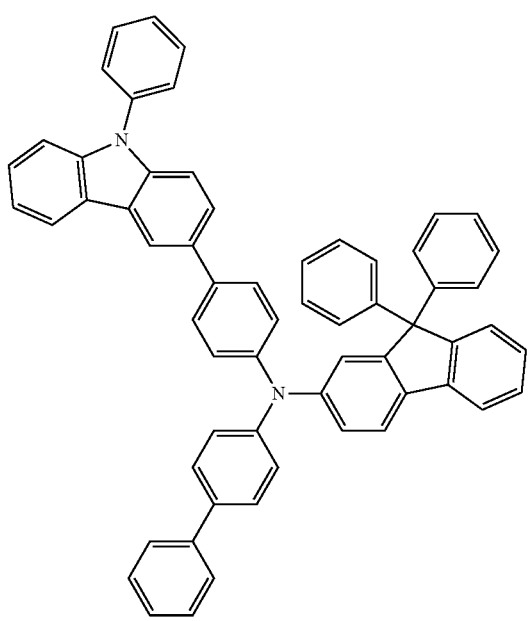
115

116
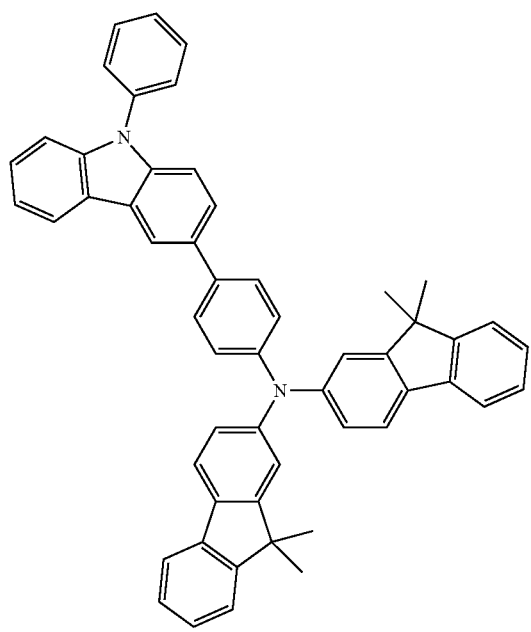
117
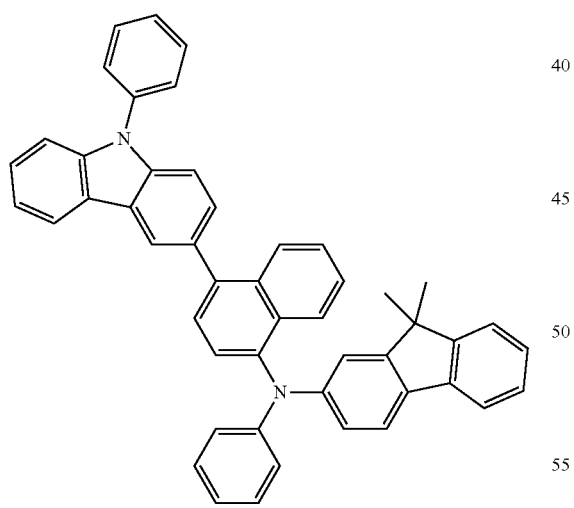
118
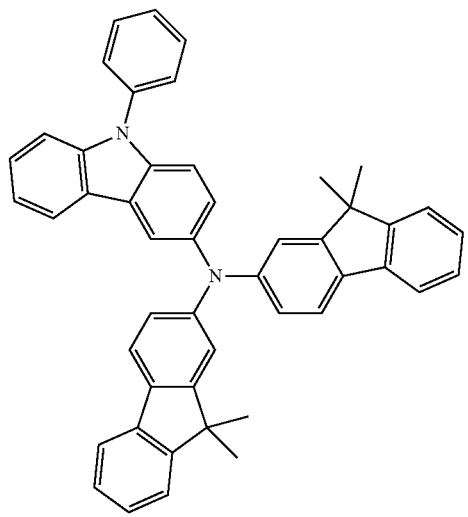
119
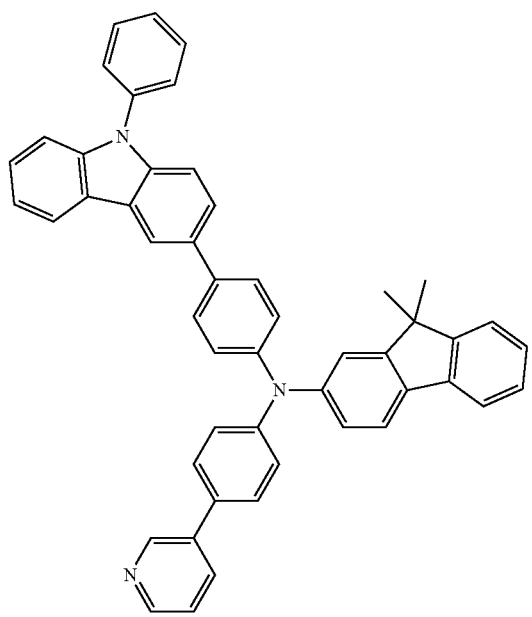

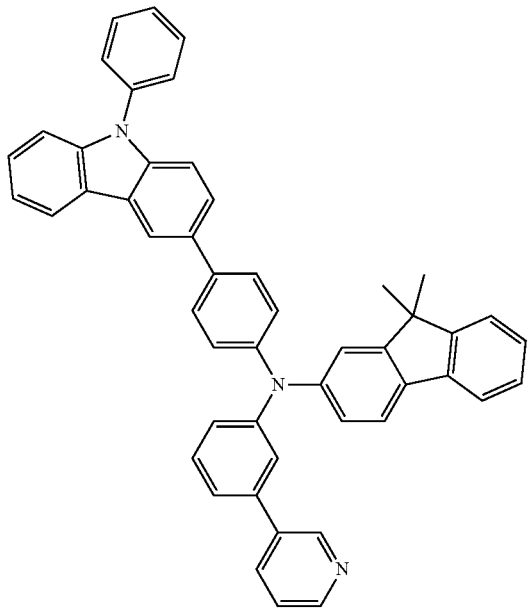

120

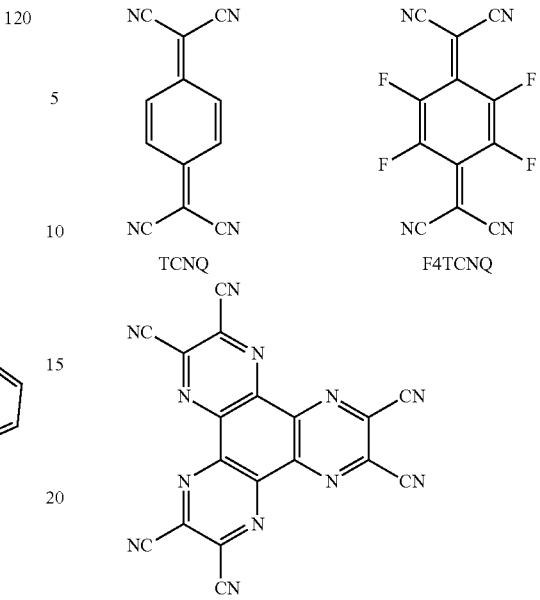

TCNQ

F4TCNQ

HATCN

121

At least one selected from the hole injection layer, the hole transport layer, and the hole injection and transport layer may further include a charge-generation material to increase conductivity of a layer, in addition to the hole injection materials, hole transport materials, and/or materials having both hole injection and hole transport capabilities, as described above.

The charge-generation material may be, for example, a p-dopant. Non-limiting examples of the p-dopant may include a quinone derivative such as TCNQ (tetracyanoquinodimethane, tetracyanoquinonedimethane) or F4-TCNQ (tetrafluoro tetracyano quinodimethane, tetrafluoro tetracyano quinodimethane); a metal oxide such as a tungsten oxide or a molybdenum oxide; Compound HATCN (1,4,5,8,9,11-hexaazatriphenylene-hexacarbonitrile, 1,4,5,8,9,11-hexaazatriphenylene-hexacarbonitrile) and the like.

When the hole injection layer, the hole transport layer, and/or the hole injection and transport layer further include the charge-generation material, the charge-generation material may be homogeneously or inhomogeneously dispersed in the layer(s).

Subsequently, an emission layer (EML) may be formed on the hole transport layer or the hole injection and transport layer by using one or more suitable methods such as spin coating, casting, and/or a LB method. When the emission layer is formed by vacuum deposition and/or spin coating, the deposition and coating conditions may be similar to those for the formation of the hole injection layer, although the conditions for deposition and coating may vary according to the material that is used to form the emission layer.

The emission layer may include the delayed fluorescence emitting dopant, the first host, and the second host.

In some embodiments, the delayed fluorescence emitting dopant may be a compound that satisfies Equation 1, and in which a gap $\Delta E_D$ between the triplet energy $E_D(T1)$ and the singlet energy $E_D(S1)$ may be in a range of about 0.01 eV to about 0.3 eV.

$$0.01 \text{ eV} \leq \Delta E_D = E_D(S1) - E_D(T1) \leq 0.3 \text{ eV}. \qquad \text{<Equation 1>}$$

When $\Delta E_D$ is within the aforementioned range, an up-conversion from the triplet state to the singlet state may be facilitated.

The dopant may be a compound represented by at least one selected from Formula 1 to Formula 4.

The host may include the first host and the second host.

The triplet energies of the first host and the second host may satisfy Equation 2, and may be equal to or greater than the triplet energy of the dopant.

$$E_{H1}(T1) \geq E_D(T1), \text{ and } E_{H2}(T1) \geq E_D(T1). \qquad \text{<Equation 2>}$$

In some embodiments, both the first host and the second host may transfer the triplet energy thereof to the triplet energy of the dopant.

In addition, the triplet energy of at least one selected from the first host and the second host may satisfy Equation 3, and may be in a range of about 2.6 eV to about 3.1 eV. For example, the triplet energy of the first host may be in a range of about 2.6 eV to about 3.1 eV. Here, the triplet energy of the first host may be greater than the triplet energy of the second host. In some embodiments, the triplet energies of the first host and the second host may be in a range of about 2.6 eV to about 3.1 eV. In some embodiments, the triplet energy of the first host may be greater than the triplet energy of the second host.

$$2.6 \text{ eV} < E_{H1}(T1) < 3.1 \text{ eV}. \qquad \text{<Equation 3>}$$

In a comparative blue emitting dopant, the energy band gap is large, and thus the levels of the triplet energy and the singlet energy are increased. However, when a dopant has delayed fluorescence emitting characteristics, the gap between the triplet energy level and the singlet energy level of the dopant is relatively small, and a molecular orbital distribution is similar, and thus an energy reverse-transfer may occur, in which electrons transit from the excited triplet state to the singlet excited state. In this case, the triple energy level of a delayed fluorescence emitting dopant may be higher than that of a comparative blue emitting dopant.

Additionally, the triplet energy level of the host that would satisfy Equation 3 is in a relatively higher range than the triplet energy level of a comparative blue emitting host. Accordingly, when the triplet energy level of at least one selected from the first host and the second host is within the aforementioned range, luminescent efficiency may be improved by securing a suitable distance from the triplet energy level of the dopant to the triplet energy level of the host.

In addition, if only one host having the triplet energy that satisfies Equations 2 and 3 is used, an electron transport and injection characteristic of the host may not be satisfactory, since the electron mobility of the host is not sufficiently high, and electron transport characteristic may deteriorate, thus breaking a charge balance of the emission layer, reducing efficiency, and increasing an efficiency roll-off. However, when a mixed host is used, electron transport and injection characteristics of the host may be improved.

For example, a material for the second host may satisfy Equations 2 and 3, and may have better charge transport characteristics than those of the first host. Electron mobility of the second host may be greater than electron mobility of the first host. In some embodiments, hole mobility of the second host may be greater than hole mobility of the first host.

One or more of compounds represented by Formula 5 to Formula 7 may be used as the first host. In some embodiments, the second host may be different from the first host, and may also be a compound represented by at least one selected from Formula 5 to Formula 7.

In some embodiments, when the organic light-emitting device 10 is configured to be a full color display or a white light-emitting display, the emission layer may be patterned into a red emission layer, a green emission layer, and a blue emission layer, each corresponding to a sub pixel, and/or the emission layer may have a stacked structure of a red emission layer, a green emission layer, and a blue emission layer.

In some embodiments, the blue emission layer of the organic light-emitting device may be the emission layer according to one or more of the embodiments described above. In other words, the blue emission layer may include the delayed fluorescence emitting dopant, the first host, and the second host.

In some embodiments, the red emission layer and the green emission layer may each independently include a suitable host and a suitable dopant known to those of ordinary skill in the art.

The host of the red emission layer and the green emission layer may include, for example, at least one selected from TPBi, TBADN, ADN, CBP, CDBP and TCP.

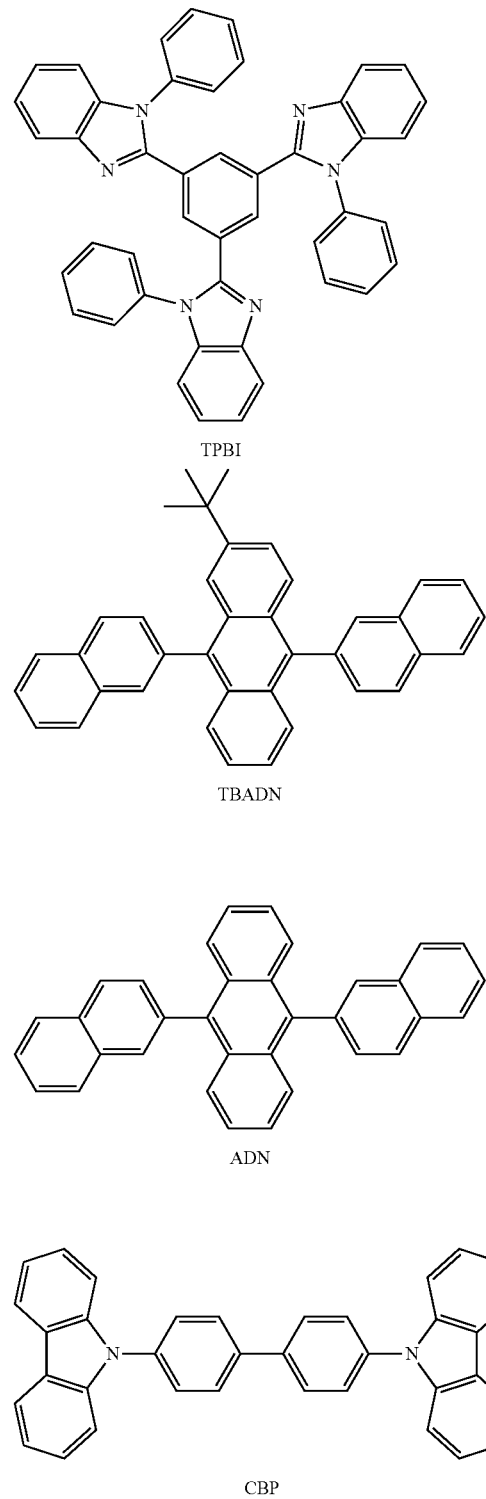

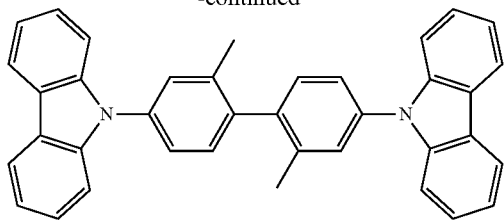

CDBP

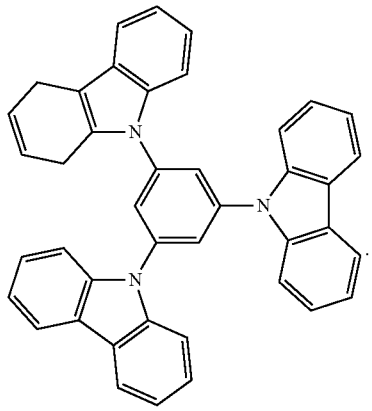

TCP

In some embodiments, the host may include a compound represented by Formula 301.

Ar$_{301}$-[(L$_{301}$)$_{xb1}$-R$_{301}$]$_{xb2}$.                Formula 301

Ar$_{301}$ in Formula 301 may be selected from:

naphthalene, heptalene, fluorene, spiro-fluorene, benzofluorene, dibenzofluorene, phenalene, phenanthrene, anthracene, fluoranthene, triphenylene, pyrene, chrysene, naphthacene, picene, perylene, pentaphene, and indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene and an indenoanthracene, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent $C_2$-$C_{60}$ non-aromatic condensed polycyclic group and –Si(Q$_{301}$)(Q$_{302}$)(Q$_{303}$) (where Q$_{301}$ to Q$_{303}$ are each independently selected from a hydrogen, a $C_1$-$C_{60}$ alkyl group, a $C_2$-$C_{60}$ alkenyl group, a $C_6$-$C_{60}$ aryl group and a $C_2$-$C_{60}$ heteroaryl group);

L$_{301}$ may be the same as described in connection with L$_{201}$;

R$_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group and a triazinyl group;

xb1 may be selected from 0, 1, 2, and 3;

xb2 may be selected from 1, 2, 3, and 4.

For example, in Formula 301,

L$_{301}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group and a chrysenylene group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group and a chrysenyl group;

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group and a chrysenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group and a chrysenyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group and a chrysenyl group, but embodiments of the present disclosure are not limited thereto.

For example, the host may include a compound represented by Formula 301A:

Formula 301A

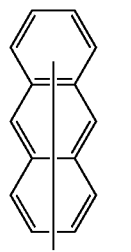

$[(L_{301})_{xb1}$–$R_{301}]_{xb2}$.

Substituents of Formula 301A may be understood by corresponding descriptions provided herein.

The compound represented by Formula 301 may include at least one selected from Compounds H1 to H42, but is not limited thereto:

H1

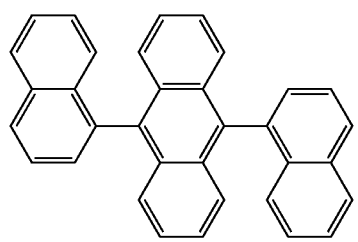

H2

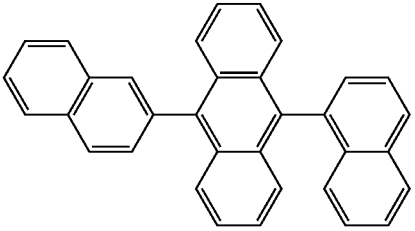

H3

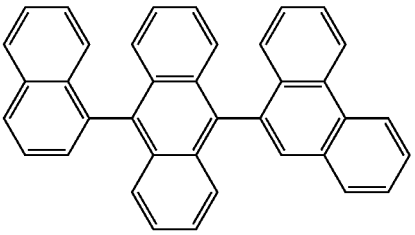

H4

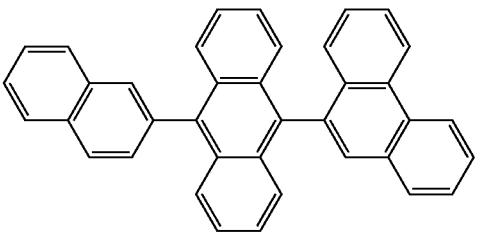

H5

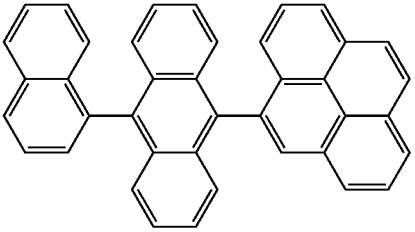

H6

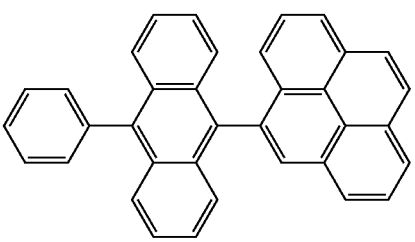

H7

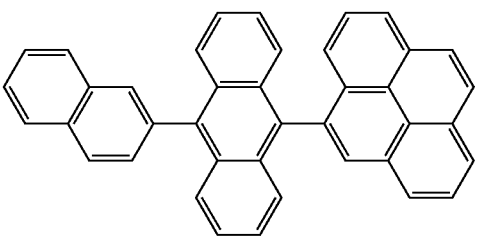

H8
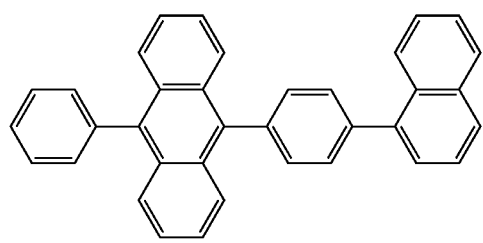
H9
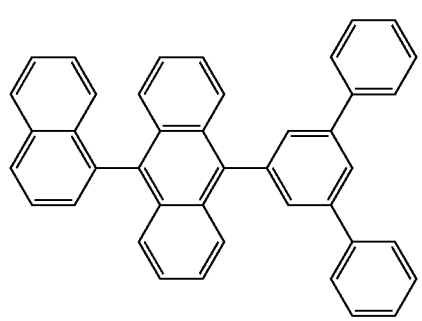
H10
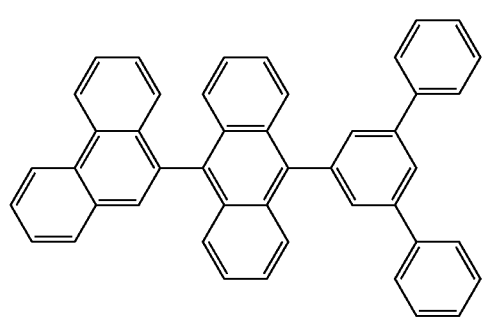
H11
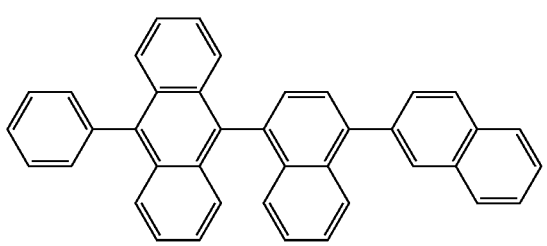
H12
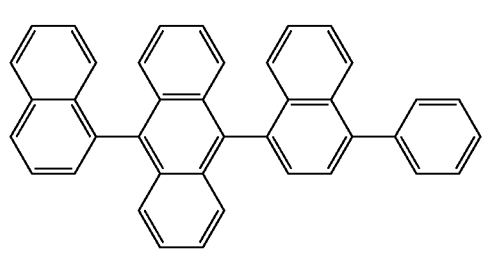
H13
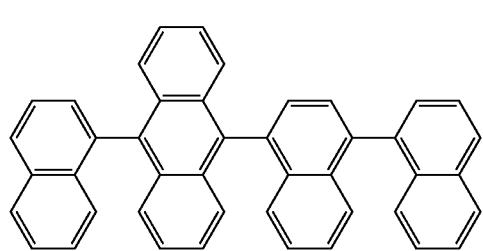
H14
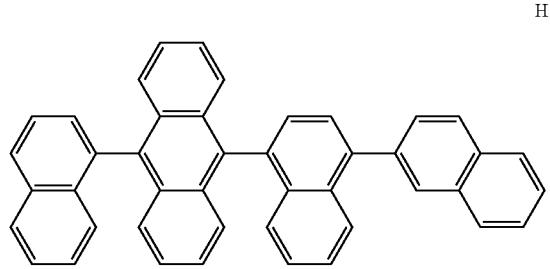
H15
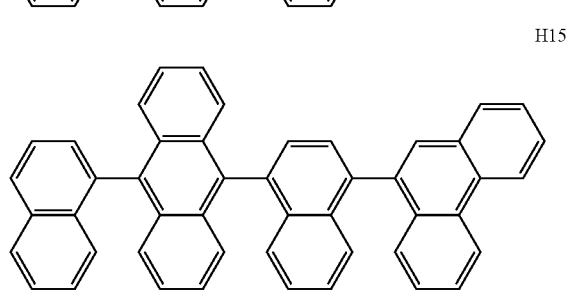
H16
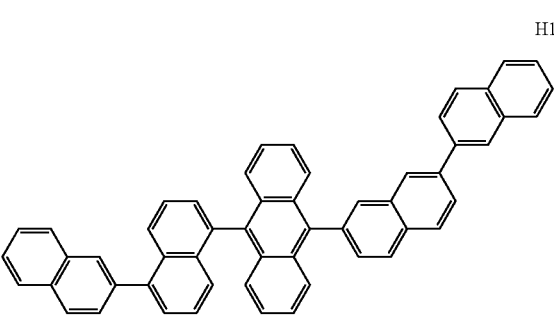
H17
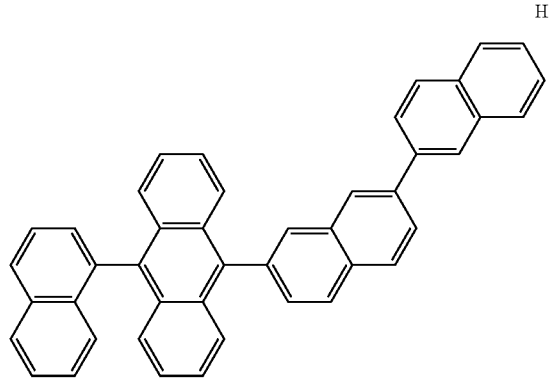
H18
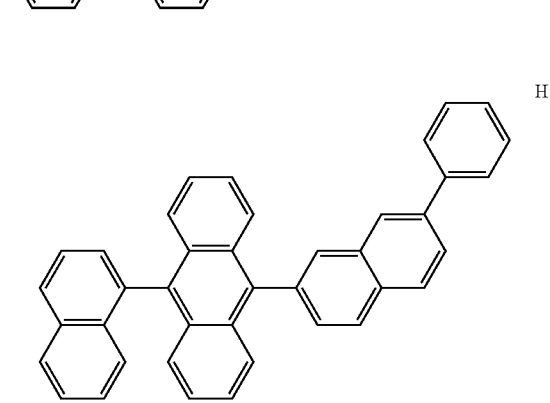

H19
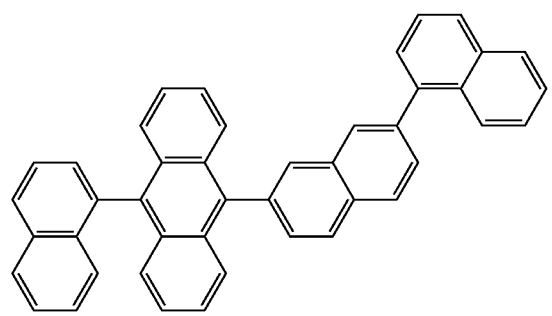
H20
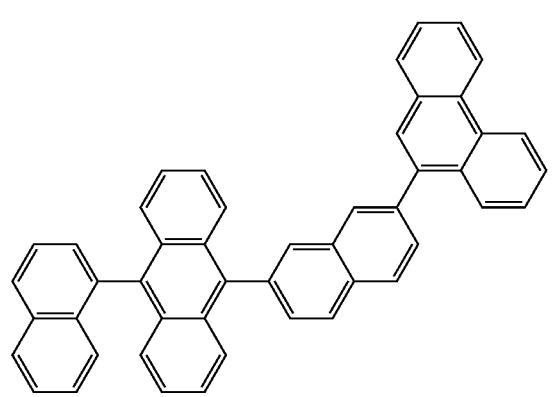
H21
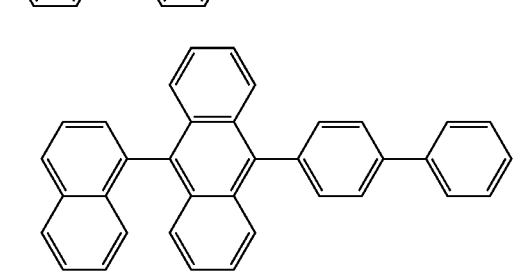
H22
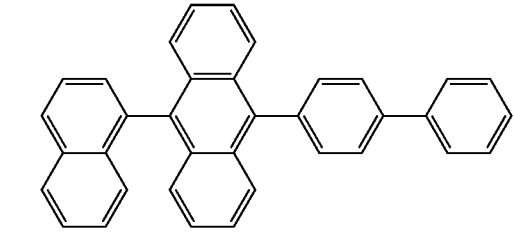
H23
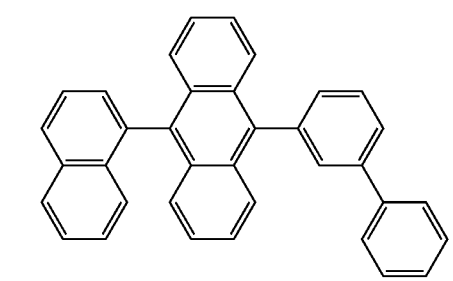
H24
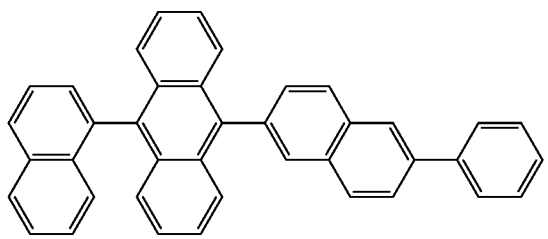
H25
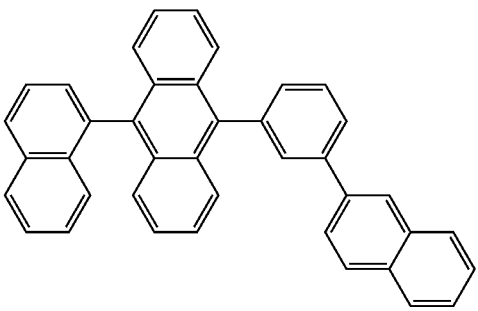
H26
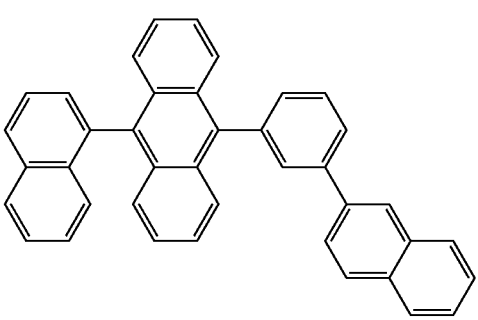
H27
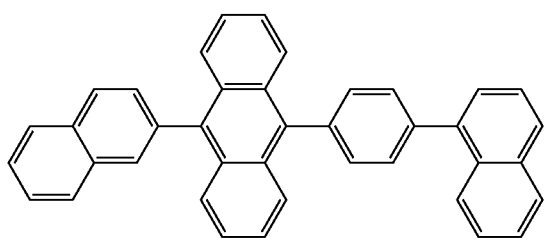
H28
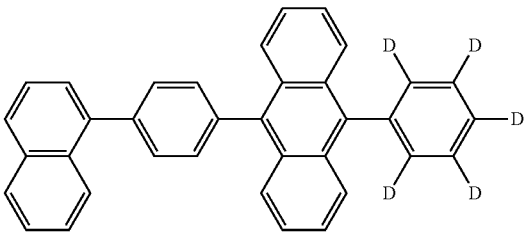

H29
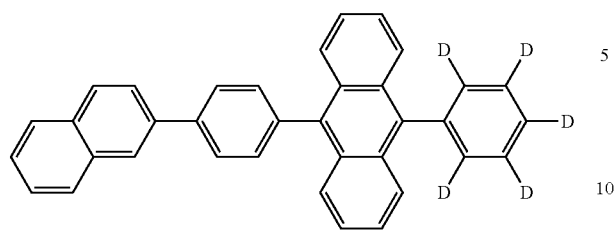
H30
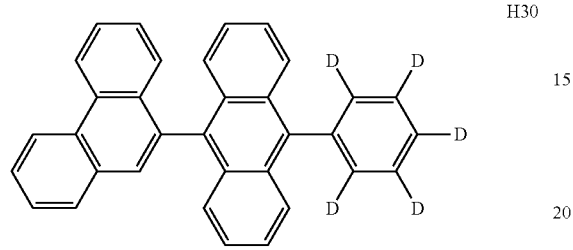
H31
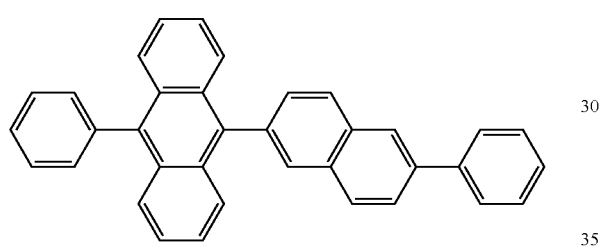
H32
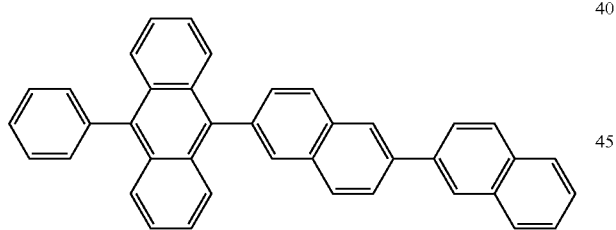
H33
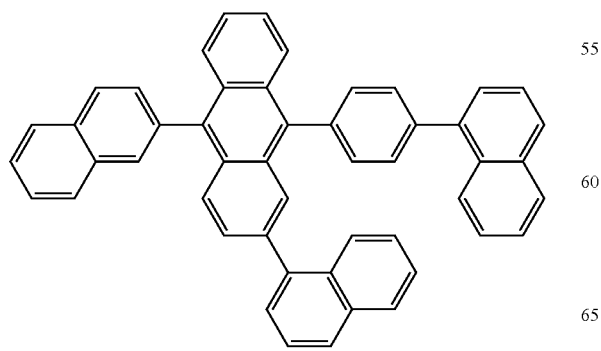
H34
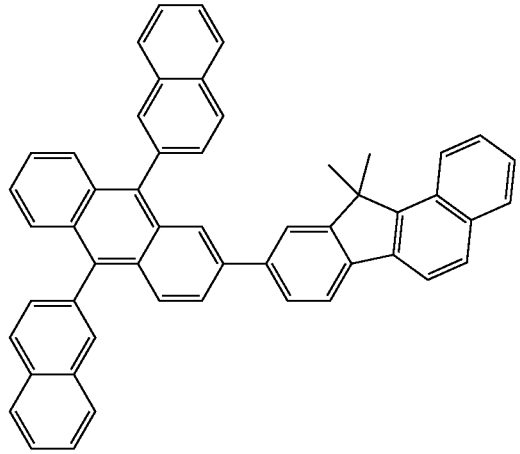
H35
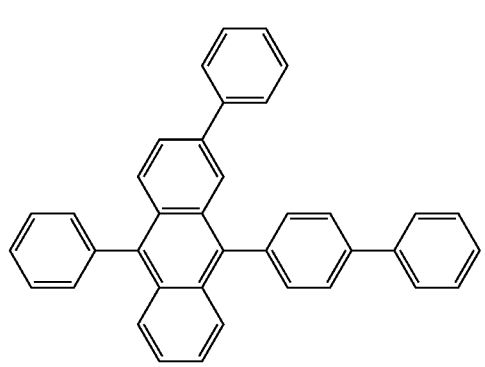
H36
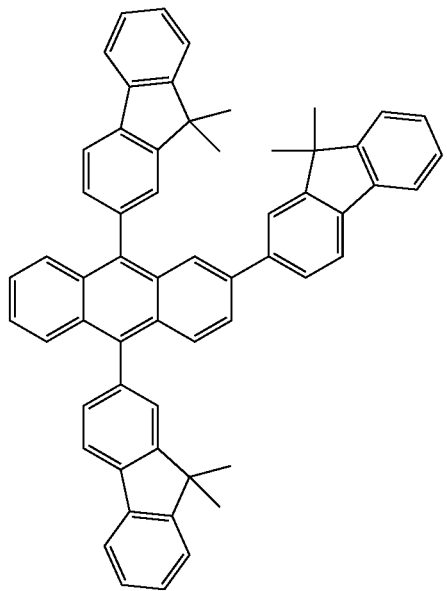

H37
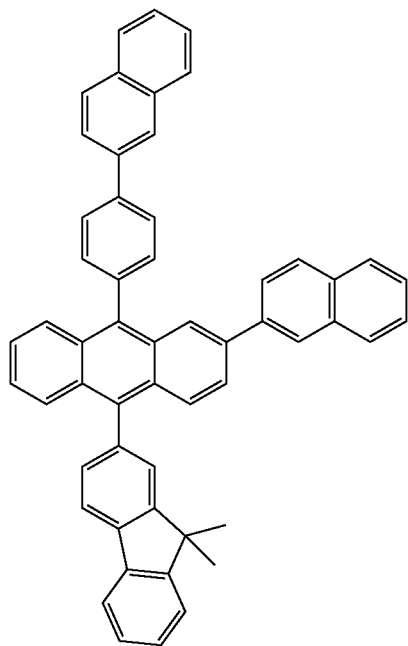
H38
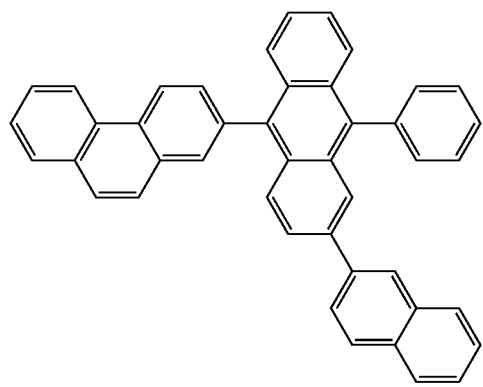
H39
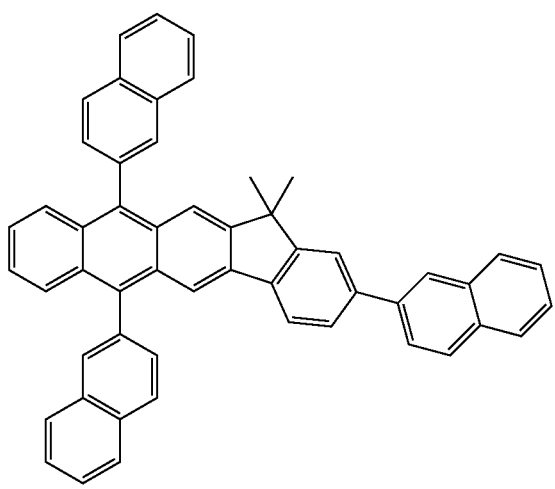
H40
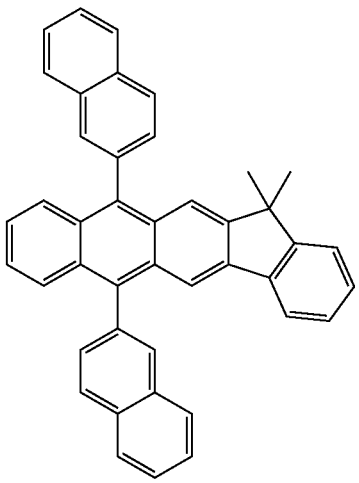
H41
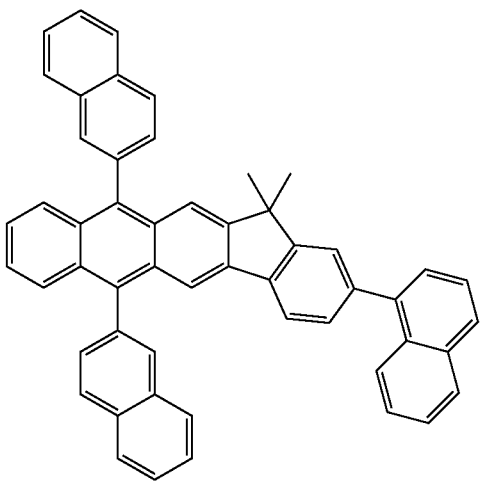
H42
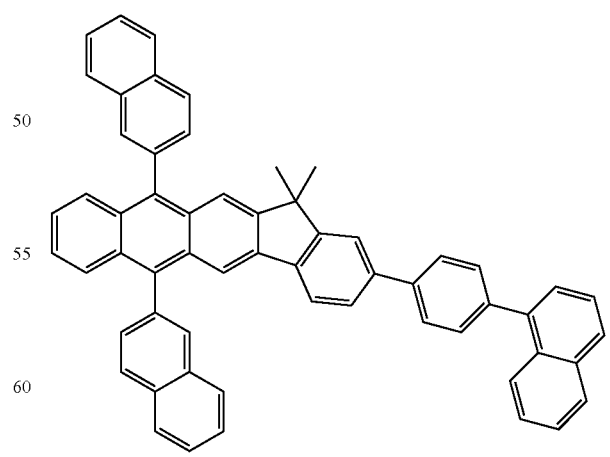
In some embodiments, the host may include at least one selected from Compounds H43 to H49 below, but is not limited thereto:

H43 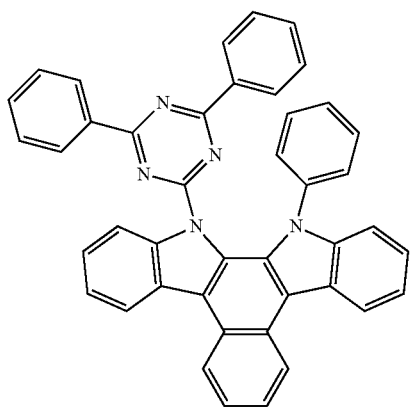
H44 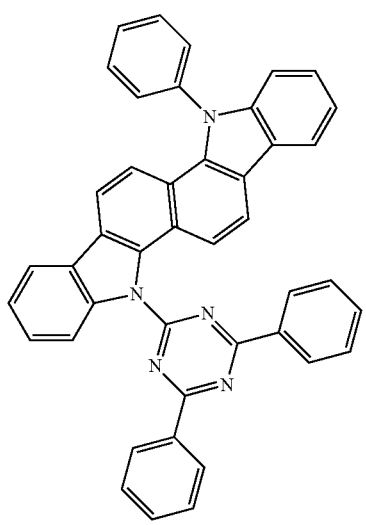
H45 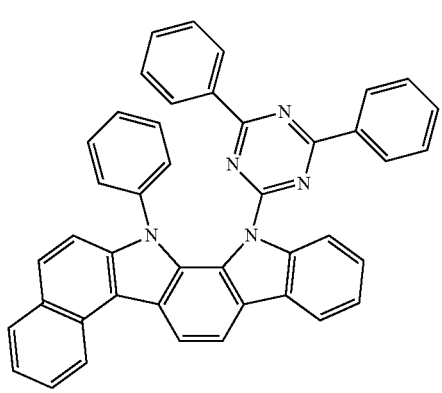
H46 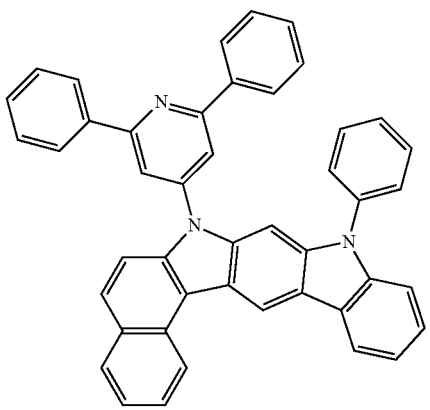
H47 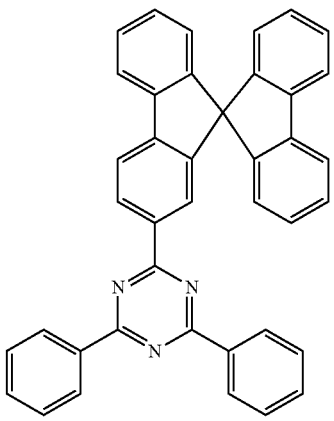
H48 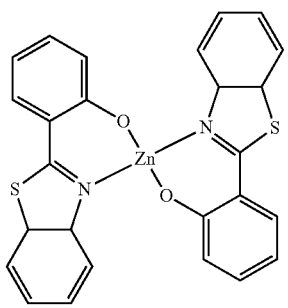
H49 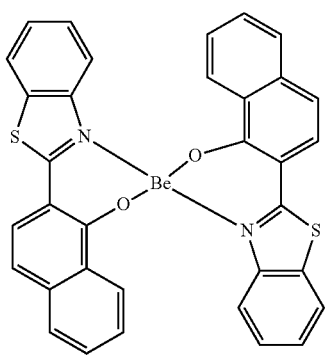
Any suitable dopant may be used as the dopant for the red emission layer and the green emission layer. The dopant may be at least one of a fluorescence emitting dopant and a phosphorescence emitting dopant. The phosphorescence emitting dopant may be an organic metallic complex including Ir, Pt, Os, Re, Ti, Zr, Hf, or a combination of at least two of these, but is not limited thereto.

In addition, compounds illustrated below including PtOEP (Pt(II) octaethylporphine, Pt(II) octaethylporphine), Ir(piq)$_3$ (tris(2-phenylisoquinoline)iridium, tris(2-phenylanisoquinoline)iridium), Btp$_2$Ir(acac) (bis(2-(2'-benzothienyl)-pyridinato-N,C3')iridium(acetylacetonate), bis(2-(2'-benzothienyl)-pyridinato-N,C3')iridium(acetylacetonate)), DCM (4-(dicyanomethylene)-2-methyl-6-[p-(dimethylamino)styryl]-4H-pyran, 4-(dicyanomethylene)-2-methyl-6-[p-(dimethylamino)styryl]-4H-pyran), and DCJTB (4-(dicyanomethylene)-2-tert-butyl-6-(1,1,7,7,-tetramethyljulolidyl-9-enyl)-4H-pyran, 4-(dicyanomethylene)-2-tert-butyl-6-(1,1,7,7,-tetramethyljulolidyl-9-enyl)-4H-pyran) may be used as the red emitting dopant, but the red emitting dopant is not limited thereto.

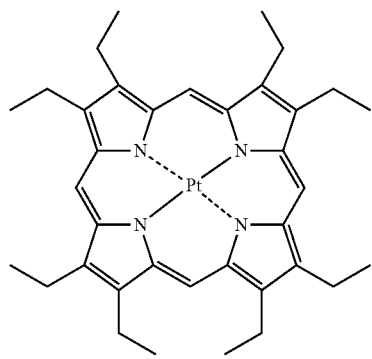

PtOEP

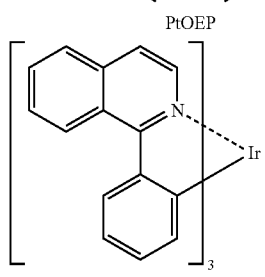

Ir(piq)3

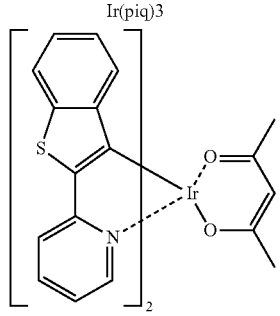

Btp2Ir(acac)

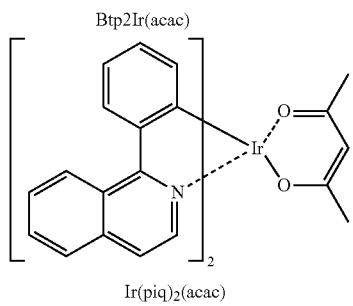

Ir(piq)$_2$(acac)

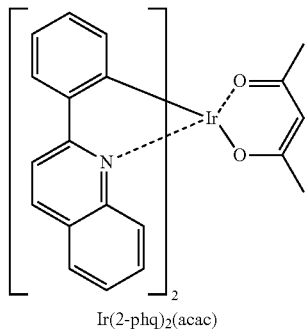

Ir(2-phq)$_2$(acac)

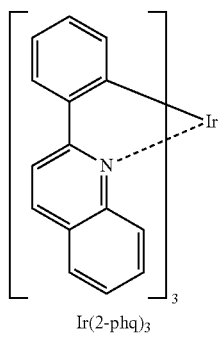

Ir(2-phq)$_3$

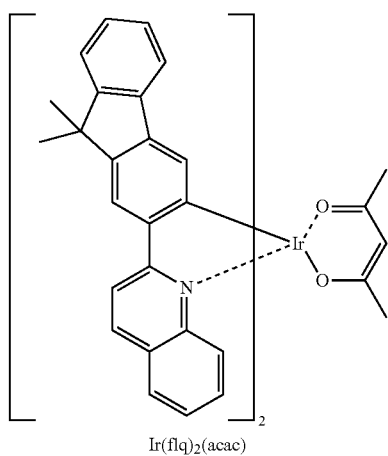

Ir(flq)$_2$(acac)

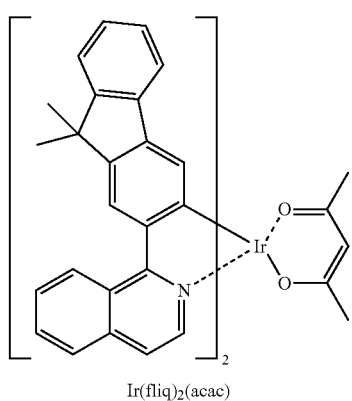

Ir(fliq)$_2$(acac)

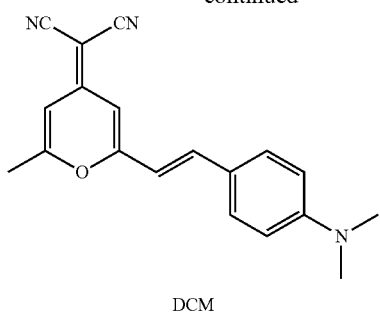

DCM

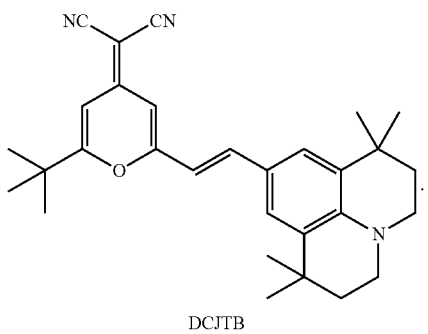 [SMILES: CC(C)(C)C1=CC(=C(C#N)C#N)C=C(/C=C/c2cc3c4c(c2)C(C)(C)CCN4CCC3(C)C)O1]

DCJTB

In some embodiments, Ir(ppy)₃(tris(2-phenylpyridine) iridium, tris(2-phenylpyridine) iridium), Ir(ppy)₂(acac) (bis (2-phenylpyridine)(acetylacetonato)iridium(III), bis(2-phenylpyridine)(acetylaceto)iridium(III)), Ir(mppy)₃ (tris(2-(4-tolyl)phenylpiridine)iridium, tris(2-(4-tolyl)phenylpyridine) iridium), C545T (10-(2-benzothiazolyl)-1,1,7,7-tetramethyl-2,3,6,7-tetrahydro-1H,5H,11H-[1]benzopyrano [6,7, 8-ij]-quinolizin-11-one, 10-(2-benzothiazolyl)-1,1,7,7-tetramethyl-2,3,6,7,-tetrahydro-1H,5H,11H-[1]benzopyrano [6,7,8-ij]-quinolizin-11-one), or the like may be used as the green emitting dopant, but the green emitting dopant is not limited thereto.

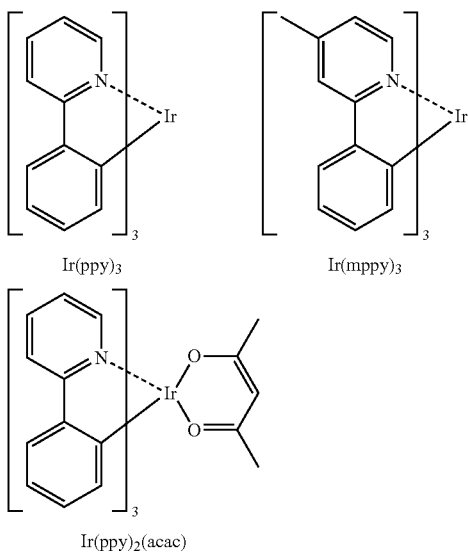

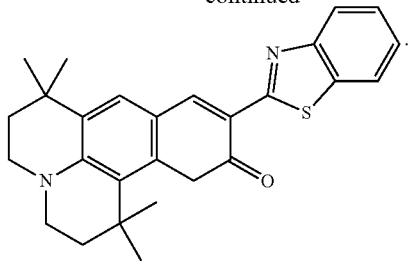

C545T

An amount of the dopant in the emission layer may be in a range of about 0.01 parts by weight to about 15 parts by weight based on 100 parts by weight of the host, but is not limited thereto.

A thickness of the emission layer may be in a range of about 100 Å to about 1,000 Å, for example, about 200 Å to about 600 Å. When the thickness of the emission layer is within any of the aforementioned ranges, light-emission characteristics may be improved without a substantial increase in driving voltage.

A hole blocking layer (HBL) may be formed between the hole transport layer and the emission layer by one or more suitable methods such as vacuum deposition, spin coating, casting, LB deposition, and/or the like to prevent or reduce the diffusion of excitons or holes into an electron transport layer. When the hole blocking layer is formed by vacuum deposition and/or spin coating, the deposition and/or coating conditions may be similar to those for the formation of the hole injection layer, although the conditions for deposition and/or coating may vary depending on the material that is used to form the hole blocking layer. A hole blocking material may include any suitable hole blocking material, and non-limiting examples thereof include an oxadiazole derivative, a triazole derivative, a phenanthroline derivative, and the like. For example, BCP (2,9-dimethyl-4,7-diphenyl-1,10-phenanthroline, 2,9-dimethyl-4,7-diphenyl-1,10-phenanthroline) may be used as a hole blocking material.

A thickness of the hole blocking layer may be in a range of about 50 Å to about 1,000 Å, for example, about 100 Å to about 300 Å. When the thickness of the hole blocking layer is within any of the aforementioned ranges, the hole blocking layer may have improved hole blocking characteristics without a substantial increase in driving voltage.

Next, the electron transport layer (ETL) may be formed by using one or more suitable methods such as vacuum deposition, spin coating, and/or casting. When the electron transport layer is formed by vacuum deposition and/or spin coating, the vacuum deposition and/or coating conditions may be similar to those for the formation of the hole injection layer, although the conditions for vacuum deposition and/or coating may vary depending on the material that is used to form the electron transport layer. Any suitable electron transport material capable of safely transporting electrons injected from the electron injection electrode (cathode) may be used as the material for the electron transport layer.

Examples of the electron transport material may include a quinoline derivative such as Alq₃, BCP (2,9-dimethyl-4, 7-diphenyl-1,10-phenanthroline, 2,9-dimethyl-4,7-diphenyl-1,10-phenanthroline), Bphen (4,7-diphenyl-1,10-phenanthroline, 4,7-diphenyl-1,10-phenanthroline), TAZ (3-(4-biphenylyl)-4-phenyl-5-tert-butylphenyl-1,2,4-triazole, 3-(4-biphenylyl)-4-phenyl-5-tert-butylphenyl-1,2,4-triazole), NTAZ (4-(naphthalen-1-yl)-3,5-diphenyl-4H-1,2,4-triazole, 4-(naphthalene-1-yl)-3,5-diphenyl-4H-1,2,4-triazole), tBu-PBD (2-(4-biphenylyl)-5-(4-tert-butylphenyl)-1,3,4-oxadiazole, 2-(4-biphenylyl)-5-(4-tert-butylphenyl)-1,3,4-oxadiazole), BAlq (see image below), Bebq$_2$ (beryllium bis(benzoquinolin-10-olate, beryllium bis(benzoquinolin-10-olate)), ADN (9,10-di(naphthalene-2-yl)anthracene, 9,10-di(naphthalene-2-yl)anthracene), Compound 501, Compound 502, and the like, but are not limited thereto.

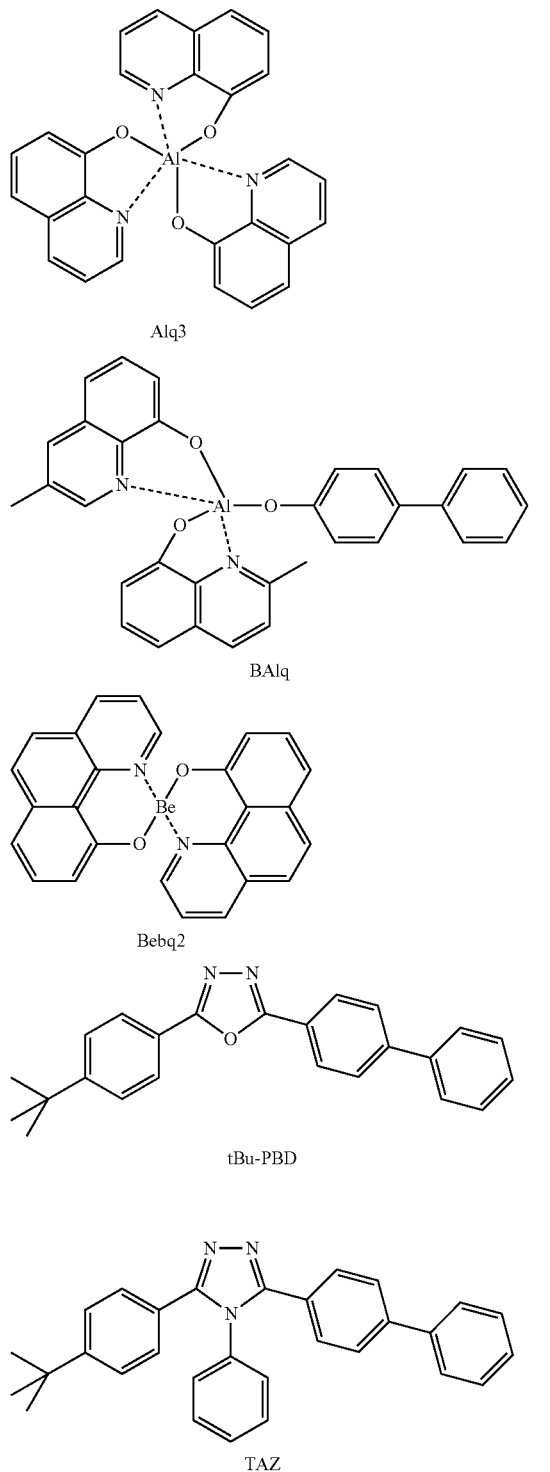

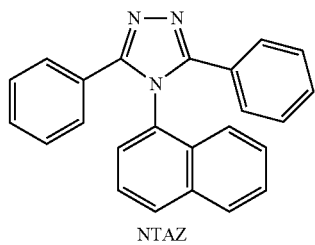

NTAZ

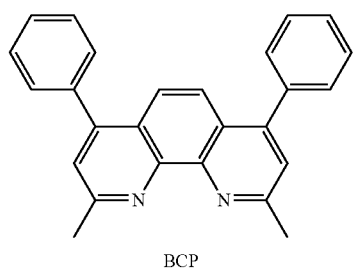

BCP

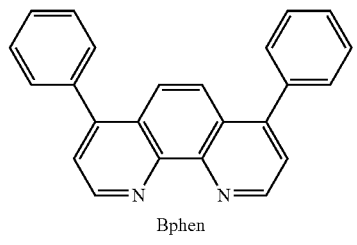

Bphen

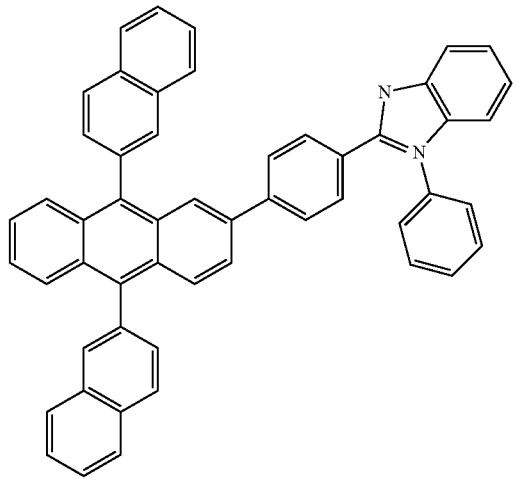

501

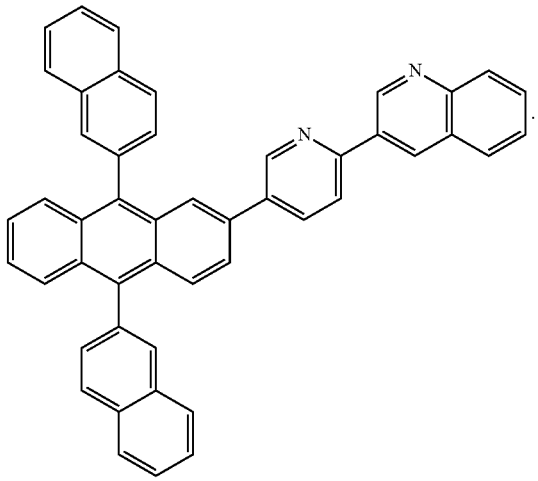

502

A thickness of the electron transport layer may be in a range of about 100 Å to about 1,000 Å, for example, about 150 Å to about 500 Å. When the thickness of the electron transport layer is within any of the aforementioned ranges, the electron transport layer may have improved electron transport characteristics without a substantial increase in a driving voltage.

In some embodiments, the electron transport layer may include an electron transport organic compound and a metal-containing material. The metal-containing material may include a Li complex. Non-limiting examples of the Li complex include lithium quinolate (LiQ) and Compound 503 illustrated below:

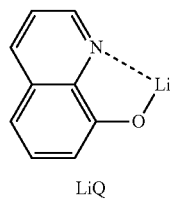

LiQ

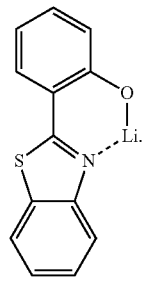

503

Then, an electron injection layer (EIL), capable of facilitating injection of electrons from the cathode, may be formed on the electron transport layer. Any suitable electron injection material may be used to form the electron injection layer.

Non-limiting examples of materials for forming the electron injection layer include LiF, NaCl, CsF, $Li_2O$, and BaO, which are known to those of ordinary skill in the art. The deposition conditions for the electron injection layer may be similar to those used to form the hole injection layer, although the deposition conditions may vary depending on the material that is used to form the electron injection layer.

A thickness of the electron injection layer may be in a range of about 1 Å to about 100 Å, for example, about 3 Å to about 90 Å. When the thickness of the electron injection layer is within any of the aforementioned ranges, the electron injection layer may have improved electron injection characteristics without a substantial increase in a driving voltage.

The second electrode 17 may be positioned on the organic layer 15. The second electrode may be a cathode that is an electron injection electrode, and in this regard, a metal for forming the second electrode may be a material having a low work function, and non-limiting examples of such material may include a metal, an alloy, an electrically conductive compound, and mixtures thereof. For example, lithium (Li), magnesium (Mg), aluminum (Al), aluminum-lithium (Al—Li), calcium (Ca), magnesium-indium (Mg—In), and/or magnesium-silver (Mg—Ag) may be formed as a thin film to obtain a transmissive electrode. Also, to manufacture a top emission type (kind), light-emitting device, a transmissive electrode formed of ITO or IZO may be used.

The $C_1$-$C_{20}$ alkyl group as used herein may refer to a linear or branched aliphatic hydrocarbon monovalent group having 1 to 20 carbon atoms in the main carbon chain, and non-limiting examples thereof include a methyl group, an ethyl group, a propyl group, an isobutyl group, a sec-butyl group, a pentyl group, an iso-amyl group, and a hexyl group.

The $C_1$-$C_{20}$ alkoxy group may be represented by —OA (where A indicates the substituted or unsubstituted $C_1$-$C_{20}$ alkyl group as described above), and non-limiting examples thereof include a methoxy group, an ethoxy group, an isopropyloxy group, and the like.

The $C_6$-$C_{30}$ aryl group may refer to a monovalent group having a carbocyclic aromatic system having 6 to 30 carbon atoms as ring-forming atoms and including at least one aromatic ring. The $C_6$-$C_{30}$ arylene group may refer to a divalent group having a carbocyclic aromatic system having 6 to 30 carbon atoms as ring-forming atoms and including at least one aromatic ring. When the aryl group and/or the arylene group have at least two rings, the rings may be fused to each other.

Non-limiting examples of the $C_6$-$C_{30}$ aryl group include a phenyl group, a $C_1$-$C_{10}$ alkylphenyl group (for example, an ethylphenyl group), a $C_1$-$C_{10}$ alkyibiphenyl group (for example, an ethylbiphenyl group), a halophenyl group (for example, an o-, m- or p-fluorophenyl group, or a dichlorophenyl group), a dicyanophenyl group, a trifluoromethoxyphenyl group, an o-, m-, or p-tolyl group, an m-, or p-cumenyl group, a mesityl group, a phenoxyphenyl group, a (α,α-dimethylbenzene)phenyl group, a (N,N'-dimethyl)aminophenyl group, a (N,N'-a diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethylchrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group.

The $C_2$-$C_{30}$ heteroaryl group as used herein may refer to a monovalent group having a system composed of one or more aromatic rings having at least one hetero atom selected from nitrogen (N), oxygen (O), phosphorous (P), silicon (Si), and sulfur (S) in at least one ring, and carbon atoms as the remaining ring-forming atoms. The $C_2$-$C_{30}$ heteroarylene group as used herein may refer to a divalent group having a system composed of one or more aromatic rings having at least one hetero atom selected from nitrogen (N), oxygen (O), phosphorous (P), silicon (Si), and sulfur (S) in at least one ring, and carbon atoms as the remaining ring-forming atoms. In this regard, when the heteroaryl group and/or the heteroarylene group each include two or more rings, the rings may be fused to each other.

Non-limiting examples of the $C_2$-$C_{30}$ heteroaryl group include a pyrazolyl group, an imidazolyl group, an oxazolyl group, a thiazolyl group, a triazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazo pyridinyl group, and an imidazo pyrimidinyl group.

The $C_6$-$C_{30}$ aryloxy group may be represented by —$OA_2$ (where $A_2$ indicates the substituted or unsubstituted $C_6$-$C_{30}$ aryl group), and the $C_6$-$C_{30}$ arylthio group may be represented by —$SA_3$ (where $A_3$ indicates the substituted or unsubstituted $C_6$-$C_{30}$ aryl group).

Definitions of functional groups not expressly described herein should be apparent to those of ordinary skill in the art.

Compounds represented by Formula 5 to Formula 7 may be each independently synthesized using any suitable organic synthesizing method known to those of ordinary skill in the art.

Hereinafter, an organic light-emitting device according to some embodiments will be described in detail with reference to Synthesis Examples and Examples. Compounds used in Examples are shown in Table 1.

TABLE 1

H1
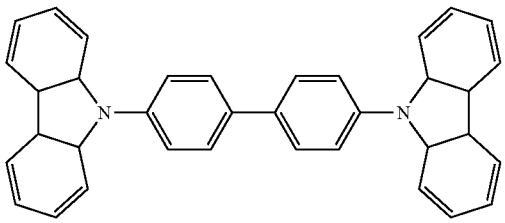 [SMILES: C1=CC2C3C=CC=CC3N(c3ccc(-c4ccc(N5C6C=CC=CC6C6C=CC=CC65)cc4)cc3)C2C=C1]

H2
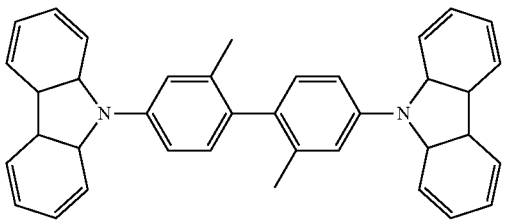 [SMILES: Cc1cc(N2C3C=CC=CC3C3C=CC=CC32)ccc1-c1ccc(N2C3C=CC=CC3C3C=CC=CC32)cc1C]

H3
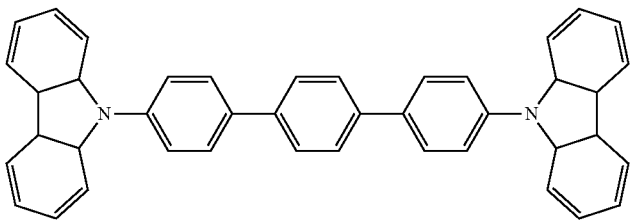 [SMILES: C1=CC2C3C=CC=CC3N(c3ccc(-c4ccc(-c5ccc(N6C7C=CC=CC7C7C=CC=CC76)cc5)cc4)cc3)C2C=C1]

H4
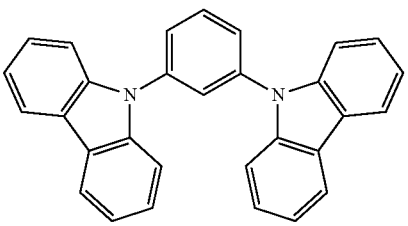 [SMILES: c1cc(-n2c3ccccc3c3ccccc32)cc(-n2c3ccccc3c3ccccc32)c1]

TABLE 1-continued
H5
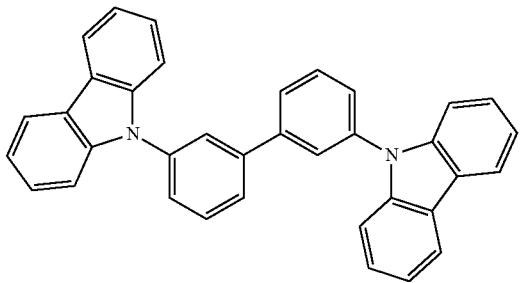 [SMILES: c1cc(-c2cccc(-n3c4ccccc4c4ccccc43)c2)cc(-n2c3ccccc3c3ccccc32)c1]
H6
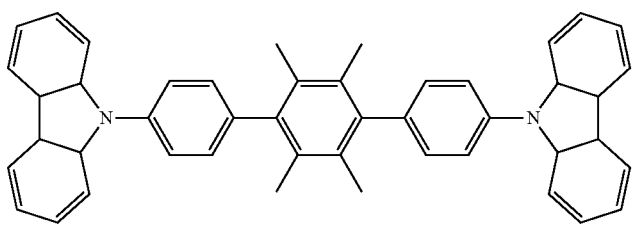 [SMILES: Cc1c(C)c(-c2ccc(N3C4C=CC=CC4C4C=CC=CC43)cc2)c(C)c(C)c1-c1ccc(N2C3C=CC=CC3C3C=CC=CC32)cc1]
H7
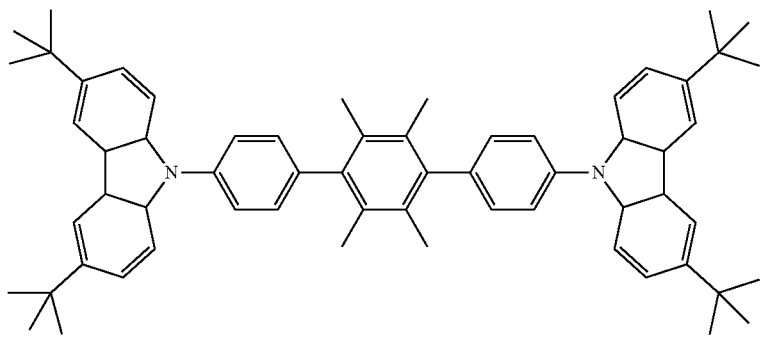 [SMILES: Cc1c(C)c(-c2ccc(N3C4C=CC(C(C)(C)C)=CC4C4C=C(C(C)(C)C)C=CC43)cc2)c(C)c(C)c1-c1ccc(N2C3C=CC(C(C)(C)C)=CC3C3C=C(C(C)(C)C)C=CC32)cc1]
D1
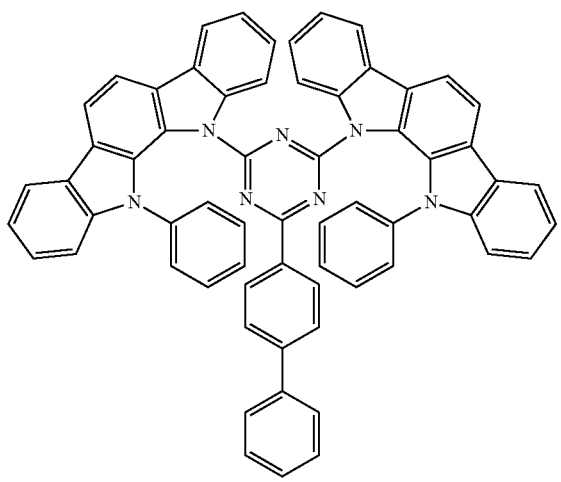 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]

TABLE 1-continued
D2
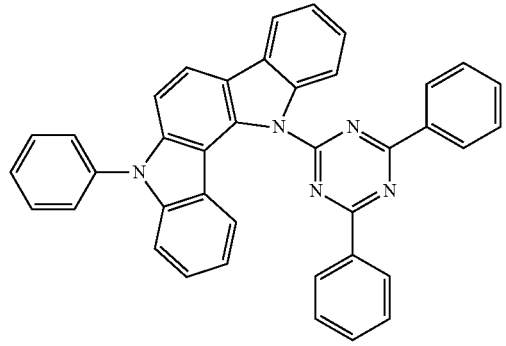 [SMILES: c1ccc(-c2nc(-c3ccccc3)nc(-n3c4ccccc4c4ccc5c(c6ccccc6n5-c5ccccc5)c43)n2)cc1]
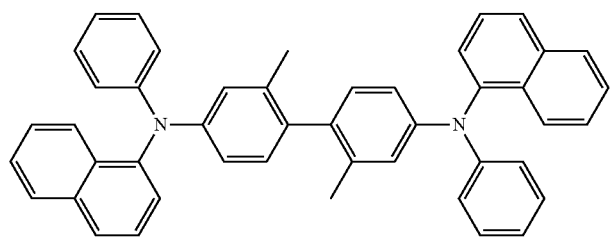 [SMILES: Cc1cc(N(c2ccccc2)c2cccc3ccccc23)ccc1-c1ccc(N(c2ccccc2)c2cccc3ccccc23)cc1C]
methylated NPB
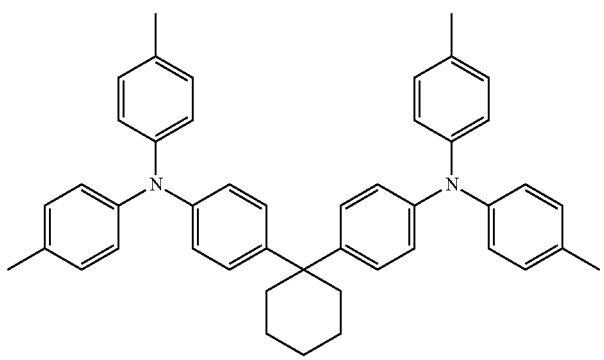
TAPC
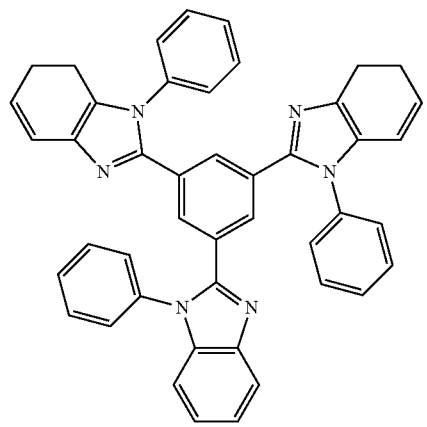 [SMILES: C1=Cc2c(nc(-c3cc(-c4nc5c(n4-c4ccccc4)CCC=C5)cc(-c4nc5ccccc5n4-c4ccccc4)c3)n2-c2ccccc2)CC1]
TPBI The triplet energies of the Compounds of H1 to H7 are shown in Table 2.

TABLE 2

| Compound | triplet energy level (eV) |
|---|---|
| H1 | 2.58 |
| H2 | 2.57 |
| H3 | 2.47 |
| H4 | 2.91 |
| H5 | 2.92 |
| H6 | 3.02 |
| H7 | 3.01 |

Example 1

As an anode, an ITO glass substrate having a thickness of 15 Ω/cm$^2$ (1200 Å) and made by Corning Inc. was cut to a size of 50 mm×50 mm×0.5 mm and then, sonicated in acetone, in isopropyl alcohol, and in pure water, for 15 minutes in each, and then, cleaned using UV ozone for 30 minutes. Next, methylated-NPD was vacuum deposited on an upper portion of the ITO glass substrate to form a hole injection layer having a thickness of 600 Å and then, TAPC was vacuum deposited on an upper portion of the hole injection layer to form a hole transport layer having a thickness of 300 Å. Compound H5 and Compound H1 were used as a host in a weight ratio of 90:10 (Compound H5:Compound H1), and the resulting host and a blue emitting dopant, which was Compound D1, were co-deposited on an upper portion of the hole transport layer in a weight ratio of 94:6 (host:dopant) to form an emission layer having a thickness of 300 Å. TPBi was vacuum deposited on an upper portion of the emission layer to form an electron transport layer having a thickness of 300 Å. LiF was vacuum deposited on an upper portion of the electron transport layer to form an electron injection layer having a thickness of 10 Å, and then, Al was vacuum deposited thereon to form a cathode having a thickness of 2,000 Å, thereby completing manufacturing of an organic light-emitting device.

Example 2

An organic light-emitting device was manufactured in the same (or substantially the same) manner as in Example 1, except that Compound H6 and Compound H3 were used as a host of an emission layer in a weight ratio of 90:10 (Compound H6:Compound H3) instead of Compound H5 and Compound H1 in a weight ratio of 90:10.

Example 3

An organic light-emitting device was manufactured in the same (or substantially the same) manner as in Example 1, except that Compound H6 and Compound H7 were used as a host of an emission layer in a weight ratio of 90:10 (Compound H6:Compound H7) instead of Compound H5 and Compound H1 in a weight ratio of 90:10.

Example 4

An organic light-emitting device was manufactured in the same (or substantially the same) manner as in Example 1, except that Compound H4 and Compound H5 were used as a host of an emission layer in a weight ratio of 70:30 (Compound H4:Compound H5) instead of Compound H5 and Compound H1 in a weight ratio of 90:10.

Example 5

An organic light-emitting device was manufactured in the same (or substantially the same) manner as in Example 2, except that Compound D2 was used as the dopant of the emission layer instead of Compound D1.

Example 6

An organic light-emitting device was manufactured in the same (or substantially the same) manner as in Example 3, except that Compound D2 was used as the dopant of the emission layer instead of Compound D1.

Example 7

An organic light-emitting device was manufactured in the same (or substantially the same) manner as in Example 4, except that Compound D2 was used as the dopant of the emission layer instead of Compound D1.

Comparative Example 1

An organic light-emitting device was manufactured in the same (or substantially the same) manner as in Example 1, except that Compound H1 was used as a host of an emission layer instead of using both Compound H5 and Compound H1 in a weight ratio of 90:10 (Compound H5:Compound H1).

Comparative Example 2

An organic light-emitting device was manufactured in the same (or substantially the same) manner as in Comparative Example 1, except that Compound D2 was used as a dopant of an emission layer instead of Compound D1.

Comparative Example 3

An organic light-emitting device was manufactured in the same (or substantially the same) manner as in Comparative Example 1, except that Compound H4 was used as a host of an emission layer instead of Compound H1.

Comparative Example 4

An organic light-emitting device was manufactured in the same (or substantially the same) manner as in Comparative Example 1, except that Compound D2 was used as a dopant of an emission layer instead of Compound D1, and Compound H4 was used as the host of the emission layer instead of Compound H1.

Evaluation Example

An external quantum efficiency of each of the organic light-emitting devices manufactured in Example 1 to Example 7, and Comparative Example 1 to Comparative Example 4 was respectively evaluated at a current density of 0.1 mA/cm$^2$ and 10 mA/cm$^2$. Results thereof are shown in Table 3:

TABLE 3

| Device | Host | Dopant | EQE (0.1 mA/cm$^2$) | EQE (10 mA/cm$^2$) |
|---|---|---|---|---|
| Example 1 | H5:H1 (90:10) | D1 | 5.1% | 4.9% |
| Example 2 | H6:H3 (90:10) | D1 | 4.8% | 4.1% |

TABLE 3-continued

| Device | Host | Dopant | EQE (0.1 mA/cm$^2$) | EQE (10 mA/cm$^2$) |
|---|---|---|---|---|
| Example 3 | H6:H7 (90:10) | D1 | 5.2% | 4.8% |
| Example 4 | H4:H5 (70:30) | D1 | 4.8% | 3.7% |
| Example 5 | H6:H3 (90:10) | D2 | 11.5% | 7.0% |
| Example 6 | H6:H7 (90:10) | D2 | 13.2% | 10.9% |
| Example 7 | H4:H5 (70:30) | D2 | 12.2% | 10.2% |
| Comparative Example 1 | H1 | D1 | 2.1% | 1.3% |
| Comparative Example 2 | H1 | D2 | 4.2% | 2.0% |
| Comparative Example 3 | H4 | D1 | 4.8% | 3.5% |
| Comparative Example 4 | H4 | D2 | 12% | 4.7% |

As illustrated by the results in Table 3, the external quantum efficiencies of the organic light-emitting devices in Example 1 to Example 7 were generally higher than those of the organic light-emitting devices in Comparative Example 1 to Comparative Example 4 at the current densities of 0.1 mA/cm$^2$ and of 10 mA/cm$^2$ respectively. Also, the external quantum efficiencies of the organic light-emitting devices in Example 1 to Example 7 at the current density of 10 mA/cm$^2$ were similar to those at the current density of 0.1 mA/cm$^2$. This may indicate that an efficiency roll-off of the organic light-emitting devices in Example 1 to Example 7 was reduced as compared to those in Comparative Example 1 to Comparative Example 4.

As described above, according to one or more of the above exemplary embodiments, when a delayed fluorescence emitting dopant and a mixed host are used in an emission layer, the resulting organic light-emitting device may have excellent efficiency and improved efficiency roll-off characteristics It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims, and equivalents thereof.

What is claimed is:
1. An organic light-emitting device comprising:
   a first electrode;
   a second electrode facing the first electrode; and
   an emission layer between the first electrode and the second electrode, the emission layer comprising a dopant, a first host, and a second host,
   wherein the dopant comprises a delayed fluorescence emitting material,
   a triplet energy of the first host, $E_{H1}(T1)$, and a triplet energy of the second host, $E_{H2}(T1)$, are each equal to or greater than a triplet energy of the dopant, $E_D(T1)$, and
   the triplet energy of the first host, $E_{H1}(T1)$ is in a range of about 2.6 eV to about 3.1 eV.
2. The organic light-emitting device of claim 1, wherein an energy gap between the triplet energy and a singlet energy of the dopant is in a range of about 0.01 eV to about 0.3 eV.
3. The organic light-emitting device of claim 1, wherein the triplet energy of the first host is greater than the triplet energy of the second host.
4. The organic light-emitting device of claim 3, wherein electron mobility of the second host is greater than electron mobility of the first host.
5. The organic light-emitting device of claim 3, wherein hole mobility of the second host is greater than hole mobility of the first host.
6. The organic light-emitting device of claim 1, wherein an amount of the dopant in the emission layer is in a range of about 0.01 parts by weight to about 30 parts by weight.
7. The organic light-emitting device of claim 3, wherein a weight ratio of the first host to the second host is in a range of about 10:90 to about 90:10.
8. The organic light-emitting device of claim 1, wherein the emission layer emits blue light.
9. The organic light-emitting device of claim 1, further comprising a hole transport region between the first electrode and the emission layer.
10. The organic light-emitting device of claim 1, further comprising an electron transport region between the second electrode and the emission layer.
11. The organic light-emitting device of claim 9, wherein the hole transport region comprises at least one selected from an electron blocking layer, a hole transport layer, and a hole injection layer.
12. The organic light-emitting device of claim 10, wherein the electron transport region comprises at least one selected from a hole blocking layer, an electron transport layer, and an electron injection layer.
13. The organic light-emitting device of claim 1, wherein the first electrode is an anode, and the second electrode is a cathode.

* * * * *